United States Patent
Shih

(10) Patent No.: US 10,685,845 B2
(45) Date of Patent: Jun. 16, 2020

(54) METHOD FOR PREPARING A SEMICONDUCTOR STRUCTURE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 17 days.

(21) Appl. No.: 16/182,061

(22) Filed: Nov. 6, 2018

(65) Prior Publication Data

US 2020/0144070 A1    May 7, 2020

(51) Int. Cl.
*H01L 21/44* (2006.01)
*H01L 21/308* (2006.01)
*H01L 21/768* (2006.01)

(52) U.S. Cl.
CPC ...... *H01L 21/3088* (2013.01); *H01L 21/3085* (2013.01); *H01L 21/3086* (2013.01); *H01L 21/76898* (2013.01)

(58) Field of Classification Search
CPC ....... H01L 2924/00014; H01L 2224/97; H01L 2224/81; H01L 2924/00012; H01L 2924/013; H01L 2924/3511; H01L 2924/15311; H01L 2224/32225; H01L 2224/73204; H01L 2224/13147; H01L 2224/81005; H01L 2924/00; H01L 23/3128; H01L 23/49816; H01L 2924/1434; H01L 21/561; H01L 24/16; H01L 2224/81192; H01L 24/97; H01L 2924/18161; H01L 25/0655; H01L 21/568; H01L 2224/16225; H01L 24/81; H01L 21/0337; H01L 21/6835; H01L 2224/83; H01L 21/4857; H01L 2221/68345; H01L 2224/131; H01L 2224/13111; H01L 2224/13139; H01L 2224/13144; H01L 2224/16227; H01L 2924/014; H01L 2924/181; H01L 2224/92125; H01L 2224/05686; H01L 25/50; H01L 23/5383; C23C 14/0652; C23C 14/08; C23C 14/10; C23C 14/16; C23C 16/06; C23C 16/345; C23C 16/402; H05K 1/181

See application file for complete search history.

(56) References Cited

U.S. PATENT DOCUMENTS 10,170,328 B1 *   1/2019   Shih .................... H01L 21/3086

* cited by examiner

*Primary Examiner* — Robert G Bachner
(74) *Attorney, Agent, or Firm* — Muncy, Geissler, Olds & Lowe, P.C.

(57) ABSTRACT

The present disclosure provides a method for preparing a semiconductor structure. The method includes the following steps. A mask stack including a first mask and a second mask is formed on a substrate. A plurality of third masks are formed. A patterned layer including first openings is formed. Portions of the second mask are removed through the first openings and the third masks to form second openings, and portions of the first mask are exposed through the second openings. A plurality of self-aligned protecting structures are formed in the second openings. Portions of the second mask exposed through the third masks are removed to form third openings, and portions of the first mask are exposed through the third openings. The portions of the first mask are removed to form a hybrid hard mask. The substrate is etched through the hybrid hard mask to form a plurality of recesses.

20 Claims, 27 Drawing Sheets

METHOD FOR PREPARING A SEMICONDUCTOR STRUCTURE

TECHNICAL FIELD

The present disclosure relates to a method for preparing a semiconductor structure, and more particularly, to a method for preparing a semiconductor structure having two-dimensional (2D) features.

DISCUSSION OF THE BACKGROUND

As the semiconductor industry introduces new generations of integrated circuits (IC's) having higher performance and greater functionality, the density of the elements that form the IC's is increased, while the dimensions, sizes, and spacing between the individual components or elements are reduced. These device geometries having smaller dimensions are creating new manufacturing challenges. In a typical integrated circuit, there may be many metallization layers and interconnecting via layers formed in an interconnect structure. The interconnect structure connects various devices (e.g., transistors, capacitors, etc.) to form functional circuits.

During fabrication, it is necessary to form openings (sometimes referred to as cuts) and connections among metal lines to create the needed connectivity. As critical dimensions continue to shrink, this can be challenging. For example, the openings must be formed large enough to ensure the metal lines are cut and separated. However, as the pitch of the metal lines is reduced, the opening may cut neighboring lines and electrical connection may be inadvertently broken. Further, the conventional cuts/openings require a tight overlay (OVL) margin, which is difficult to achieve. However, without such tight margins, resulting interconnection structures are unreliable or unusable.

It is concluded that the conventional interconnect processing fails to adequately perform in scaled technology nodes. It is therefore desirable to develop improvements that address the aforementioned challenges.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a method for preparing a semiconductor structure. The method includes the following steps. A mask stack is formed on a substrate. In some embodiments, the mask stack includes a first mask and a second mask. A plurality of third masks are formed over the mask stack. A patterned layer is formed over the third masks. In some embodiments, the patterned layer includes a plurality of first openings. Portions of the second mask are removed through the first openings and through the third masks to form a plurality of second openings. In some embodiments, portions of the first mask are exposed through the second openings. A plurality of self-aligned protecting structures are formed in the second openings. Portions of the second mask exposed through the third masks are removed to form a plurality of third openings. In some embodiments, portions of the first mask are exposed through the third openings. The portions of the first mask exposed through the third openings are removed to form a hybrid hard mask. The substrate is etched through the hybrid hard mask to form a plurality of recesses.

In some embodiments, the hybrid hard mask includes the first mask and the second mask.

In some embodiments, the hybrid hard mask further includes at least one self-aligned protecting structure.

In some embodiments, the first mask forms a base for the hybrid hard mask, the at least one self-aligned protecting structure and the second mask are disposed on the first mask, and the at least one self-aligned protecting structure is sandwiched between the portions of the second mask.

In some embodiments, a top surface of the at least one self-aligned protecting structure is coplanar with or higher than a top surface of the second mask.

In some embodiments, the third masks extend along a first direction, and the first openings extend along a second direction different from the first direction.

In some embodiments, the forming of the third masks includes the following steps. A plurality of core patterns are formed over the mask stack. A plurality of spacers are formed over sidewalls of each core pattern. The core patterns are removed to form the third masks.

In some embodiments, the forming of the patterned layer further includes the following step. A sacrificial layer is formed over the third masks to form an even surface over the substrate. The patterned layer is formed over the sacrificial layer. The first openings are transferred into the sacrificial layer.

In some embodiments, the method further includes removing the sacrificial layer prior to the forming of the third openings.

In some embodiments, the method further includes removing portions of the third masks exposed through the first openings.

In some embodiments, the method further includes forming a conductive layer to fill the recesses.

One aspect of the present disclosure provides a method for preparing a semiconductor structure. The method includes the following steps. A mask stack is formed on a substrate. In some embodiments, the mask stack includes a first mask and a second mask. A plurality of core patterns are formed over the mask stack. A plurality of spacers are formed over sidewalls of each core pattern. A patterned layer is formed over the core patterns and the spacers. In some embodiments, the patterned layer includes a plurality of first openings. Portions of the core patterns, portions of the spacers and portions of the second mask exposed through the first openings are removed to form a plurality of second openings. In some embodiments, portions of the first mask are exposed through the second openings. A plurality of self-aligned protecting structures are formed in the second openings. The core patterns are removed to form a plurality of third masks exposing portions of the second mask. The portions of the second mask exposed through the third masks and through the self-aligned protecting structures are removed to form a plurality of third openings. In some embodiments, portions of the first mask are exposed through the third openings. The portions of the first mask exposed through the third openings are removed to form a hybrid hard mask. The substrate is etched through the hybrid hard mask to form a plurality of recesses.

In some embodiments, the hybrid hard mask includes the first mask and the second mask.

In some embodiments, the hybrid hard mask further includes the self-aligned protecting structure.

In some embodiments, the first mask forms a base for the hybrid hard mask, the self-aligned protecting structure and the second mask are disposed on the first mask, and the self-aligned protecting structure is sandwiched between portions of the second mask.

In some embodiments, a top surface of the self-aligned protecting structure is coplanar with or higher than a top surface of the second mask.

In some embodiments, the third masks extend along a first direction, and the first openings extend along a second direction different from the first direction.

In some embodiments, the forming of the patterned layer further includes the following steps. A sacrificial layer is formed over the core patterns and the spacers to form an even surface over the substrate. The patterned layer is formed over the sacrificial layer. The first openings are transferred into the sacrificial layer.

In some embodiments, the method further includes removing the sacrificial layer prior to the forming of the third openings.

In some embodiments, the method further includes forming a conductive layer to fill the recesses.

In the present disclosure, a method for preparing the semiconductor structure is provided. According to the method, the self-aligned protecting structures are formed between portions of the second mask, and thus the hybrid hard mask including the first mask, the self-aligned protecting structure(s) and the second mask is obtained. Accordingly, the substrate is etched through the hybrid hard mask to form the recesses separate from each other. The recesses are then filled with conductive materials and thus a plurality of metal lines separate from each other are formed. Significantly, no more metal cutting is required, Further, since a process for cutting the metal lines is no longer required, alignment between the cuts and the metal lines is not required, either. Accordingly, the metal lines can be formed without increasing process cost or complexity.

In contrast, with a comparative method, the metal lines are formed and a metal line cutting process is subsequently performed to formed the desired circuit. As the pitch of the metal lines is reduced, the opening may cut neighboring lines and electrical connections may be inadvertently broken, and the over-cutting issue makes the interconnection structures unreliable or unusable. Further, the forming of the cuts/openings requires precise alignment, and such requirement makes the process more complicated.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
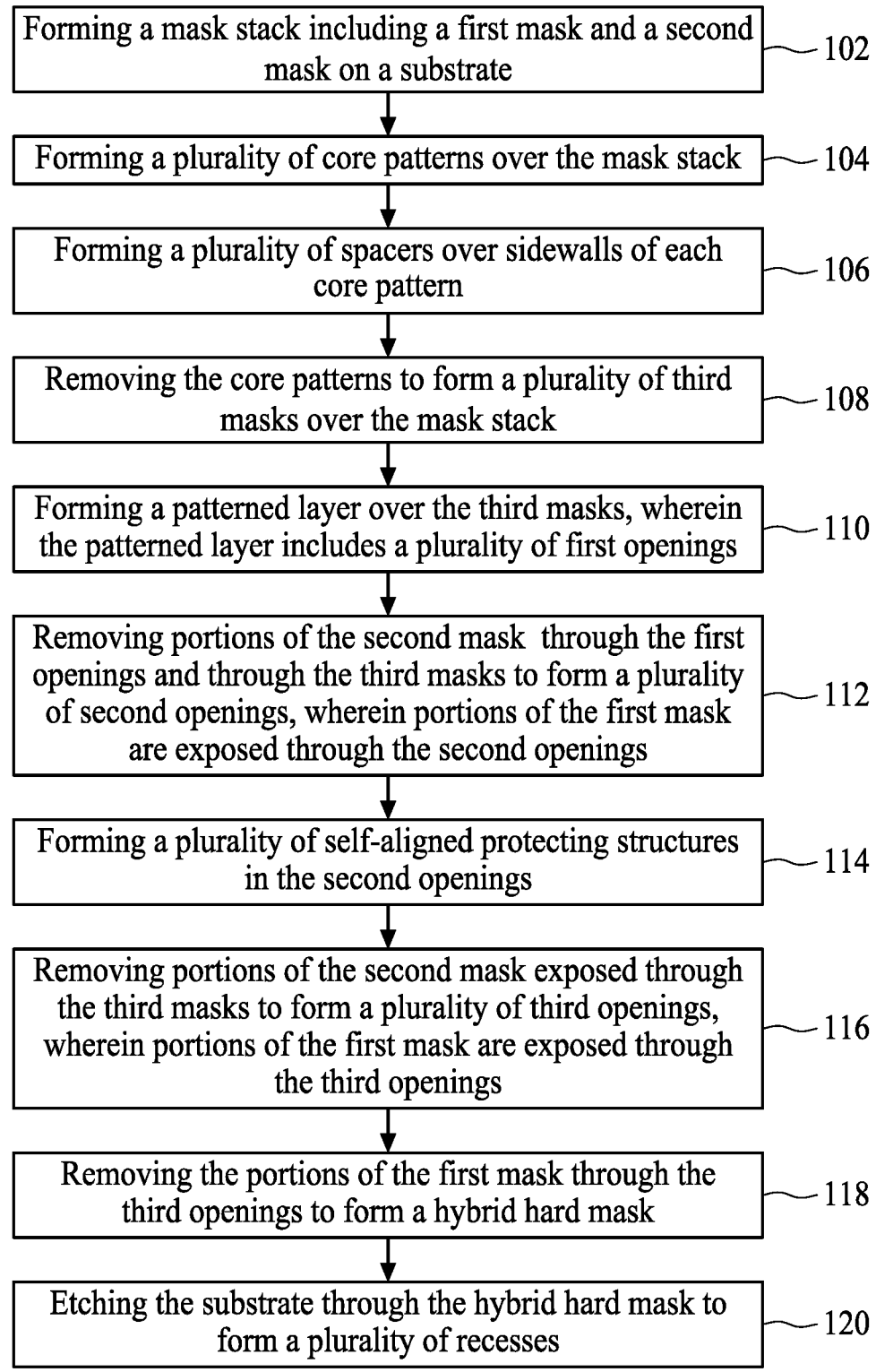
FIG. 1 is a flow diagram illustrating a method for preparing semiconductor structures, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region element, compoenet, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the term "feature" refers to parts of a pattern, such as lines, spaces, vias, pillars, trenches, troughs, or moats. As used herein, the term "core" refers to a mask feature formed at a vertical level. As used herein, the term "target layer" refers to a layer in which a pattern of semiconductor structures is to be formed. A target layer may be part of the substrate. A target layer may be a metal layer, a semiconductor layer, and/or an insulating layer formed over the substrate.

As used herein, the terms "patterning" or "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch process or other removal process. The mask can be a photoresist or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

FIG. 1 is a flow diagram illustrating a method for preparing a semiconductor structure in accordance with a first and a second embodiments of the present disclosure. The method for preparing a semiconductor structure 10 includes a step 102, forming a mask stack including a first mask and a second mask on a substrate. The method 10 further includes a step 104, forming a plurality of core patterns over the mask stack. The method 10 further includes a step 106, forming a plurality of spacers over sidewalls of each core pattern. The method 10 further includes a step 108, removing the core patterns to form a plurality of third masks over the mask stack. The method 10 further includes a step 110, forming a patterned layer over the third masks. In some embodiments, the patterned layer includes a plurality of first openings. The method 10 further includes a step 112, removing portions of the second mask through the first openings and through the third masks to form a plurality of second openings. In some embodiments, portions of the first mask are exposed through the second openings. The method 10 further includes a step 114, forming a plurality of self-aligned protecting structures in the second openings. The method 10 further includes a step 116, removing portions of the second mask exposed through the third masks to form a plurality of third openings. In some embodiments, portions of the first mask are exposed through the third openings. The method 10 further includes a step 118, removing the portions of the first mask through the third openings to form a hybrid hard mask. The method 10 further includes a step 120, etching the substrate through the hybrid hard mask to form a plurality of recesses. The method for preparing the semiconductor structure 10 will be further described according to one or more embodiments below.

Figure 2A:
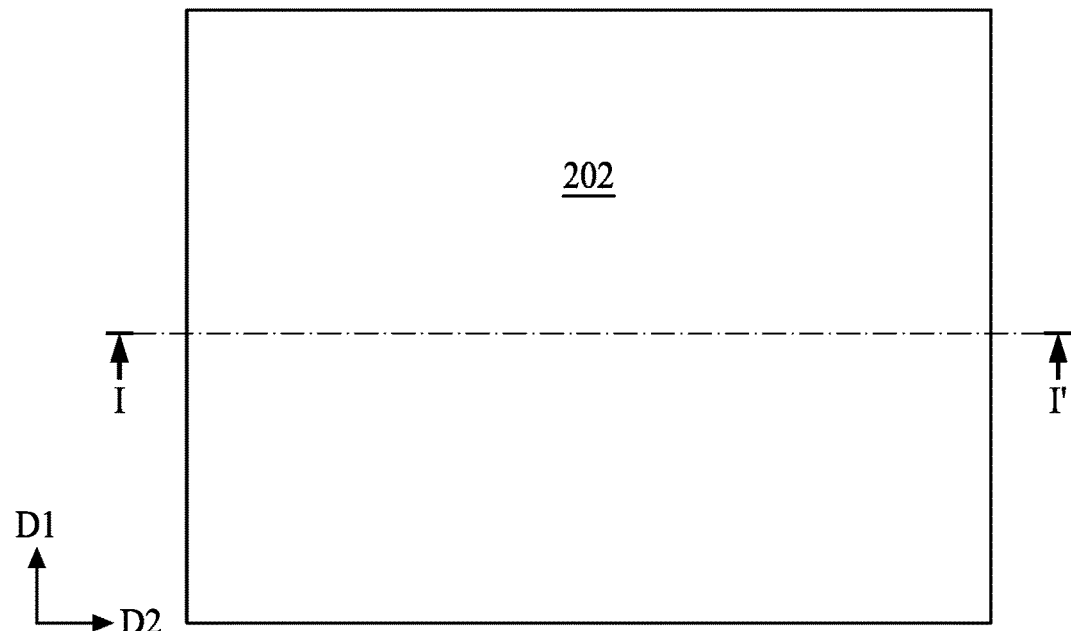
FIGS. 2A, 3A, 4A, 5A, 6A, 7A, 8A, 9A, 10A, 11A, 12A and 13A are schematic diagrams illustrating fabrication stages constructed according to the method for preparing the semiconductor structure in accordance with a first embodiment of the present disclosure.
Figure 2B:
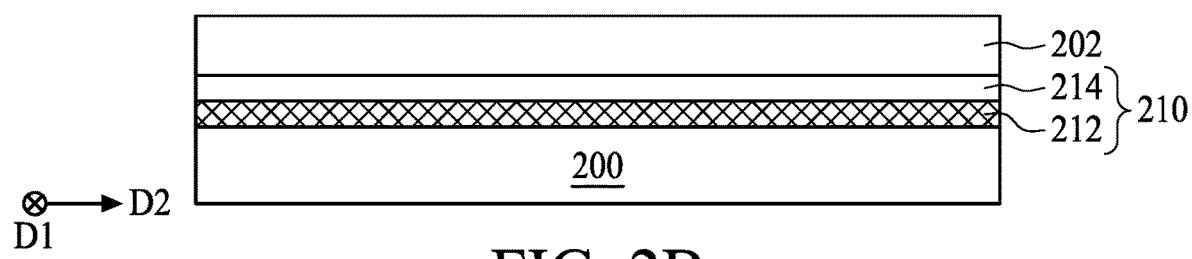
FIGS. 2B, 3B, 4B, 5B, 6B, 7B, 8B, 9B, 10B, 11B, 12B and 13B are cross-sectional views taken along line I-I' of FIGS. 2A, 3A, 4A, 5A, 6A, 7A, 8A, 9A, 10A, 11A, 12A and 13A, respectively.

FIGS. 2A, 3A, 4A, 5A, 6A, 7A, 8A, 9A, 10A, 11A, 12A and 13A are schematic diagrams illustrating fabrication stages constructed according to the method for preparing the semiconductor structure in accordance with a first embodiment of the present disclosure. FIGS. 2B, 3B, 4B, 5B, 6B, 7B, 8B, 9B, 10B, 11B, 12B and 13B are cross-sectional views taken along line I-I' of FIGS. 2A, 3A, 4A, 5A, 6A, 7A, 8A, 9A, 10A, 11A, 12A and 13A, respectively. Referring to FIGS. 2A and 2B, a substrate 200 is provided. The substrate 200 can include silicon (Si), gallium (Ga), gallium arsenide (GaAs), gallium nitride (GaN), strained silicon, silicon-germanium (SiGe), silicon carbide (SiC), diamond, epitaxy layer or the combination thereof. In some embodiments, the substrate 200 is a target layer, and the target layer can include multiple layers or a single layer. The target layer 200 may be a layer in which various IC components, parts, or structures are to be formed through IC fabrication processes. Examples of the components, parts, and structures include transistors, capacitors, resistors, diodes, conductive lines, electrodes and trenches. The target layer 200 can include materials that are selected based on the types of devices to be formed. In the first embodiment, the material used to form the target layer 200 can include a dielectric material, such as silicon oxide (SiO), but the disclosure is not limited thereto.

Still referring to FIGS. 2A and 2B, a mask stack 210 is formed on the substrate 200 according to step 102. In some embodiments of the present disclosure, the mask stack 210 includes at least a first mask 212 and a second mask 214, as shown in FIG. 2B. The first mask 212 and the second mask 214 can include different materials or materials sufficiently different in composition to allow the second mask 214 to be selectively removable using an appropriate etch chemistry relative to the first mask 212. For example but not limited thereto, the first mask 212 can include semiconductor material such as, for example but not limited thereto, polysilicon or amorphous silicon. In some embodiments, the first mask 212 can include metal such as, for example but not limited thereto, titanium (Ti), tantalum (Ta) or tungsten (W). In some embodiments, the first mask 212 can include metal nitride such as, for example but not limited thereto, titanium nitride (TiN), TaN or WN. In some other embodiments, the first mask 212 can include metal oxide such as titanium oxide (TiO). In some embodiments, the second mask 214 can include dielectric materials such as, for example but not limited thereto, SiO, silicon nitride (SiN) or Si.

Still referring to FIGS. 2A and 2B, a material layer 202 is formed on the mask stack 210. In some embodiments, the material layer 202 can include semiconductor material, such as polysilicon, but the disclosure is not limited thereto.

Figure 3A:
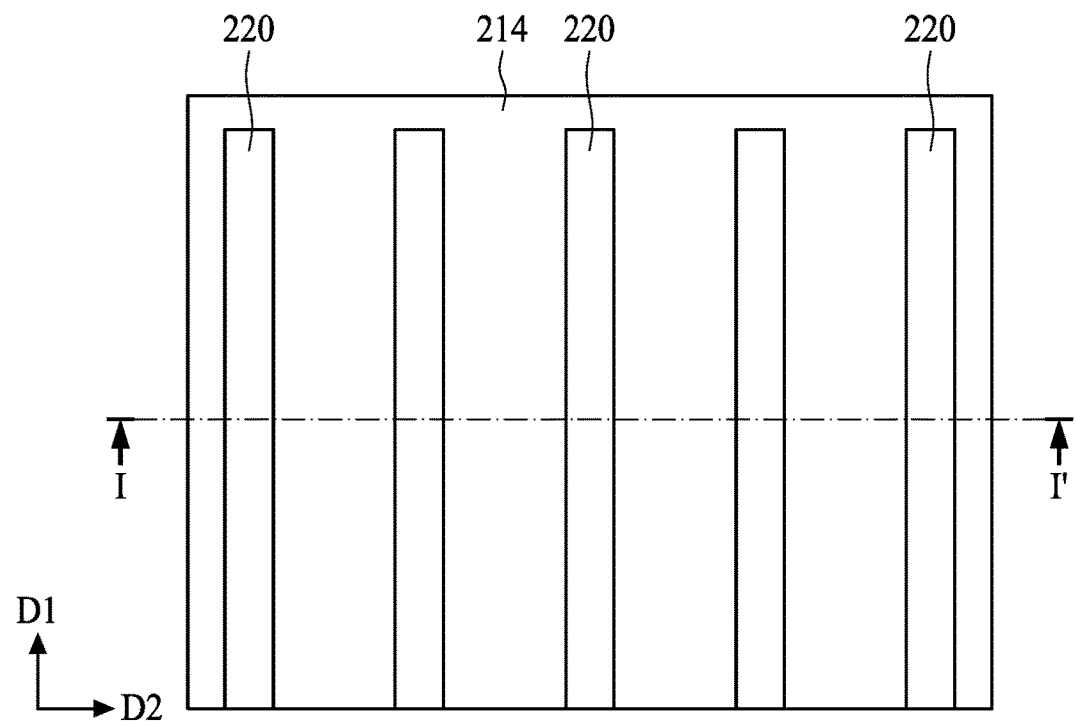
Figure 3B:
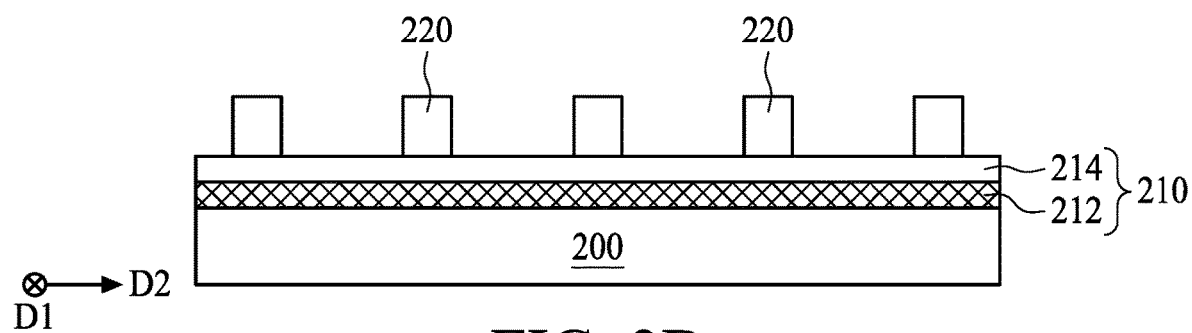

Referring to FIGS. 3A and 3B, the material layer 202 is patterned to form a plurality of core patterns 220 over the mask stack 210, according to step 104. The core patterns 220 extend along a first direction D1, as shown in FIGS. 3A and 3B.

Figure 4A:
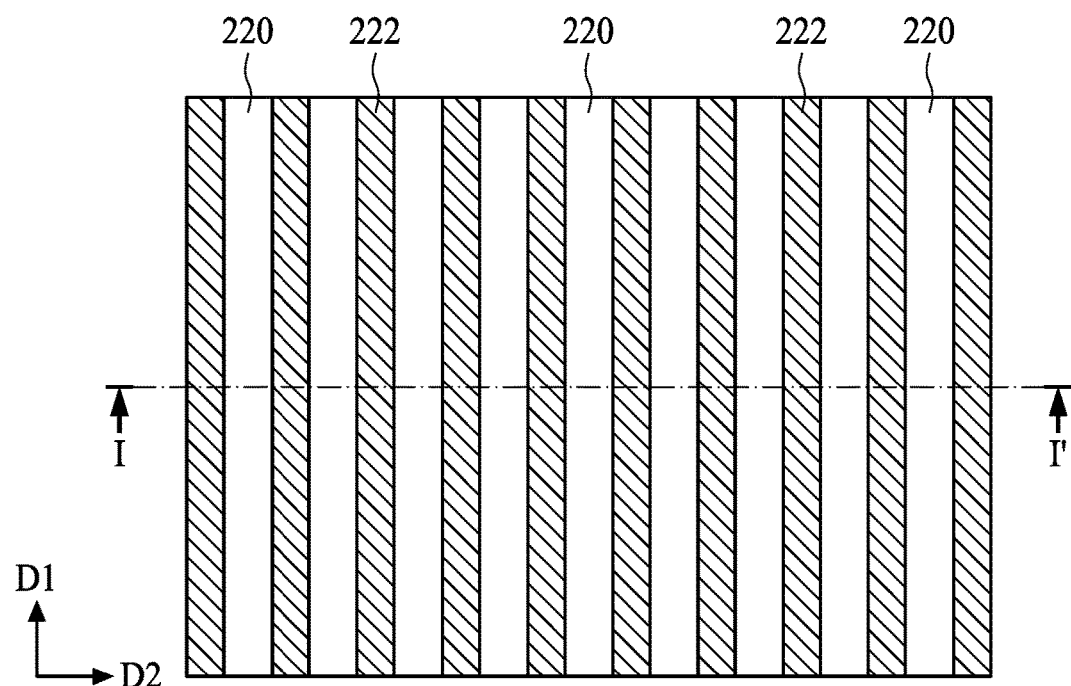
Figure 4B:
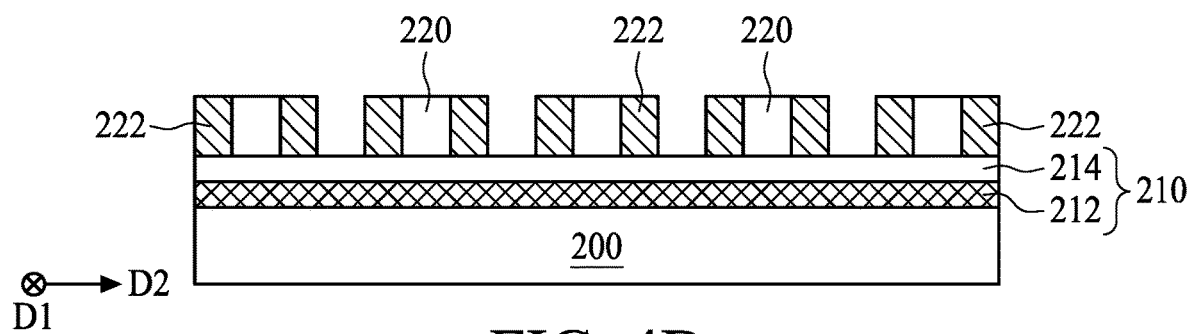

Referring to FIGS. 4A and 4B, a plurality of spacers 222 are formed over sidewalls of each core pattern 220, according to step 106. In some embodiments, the spacers 222 can be formed by performing an atomic layer deposition (ALD) and an etch back process, but the disclosure is not limited thereto. The spacers 222 include materials sufficiently different in composition to allow the core patterns 220 to be selectively removable using an appropriate etch chemistry relative to the spacers 222. For example but not limited thereto, the spacers 222 can includes SiO, SiN, or TiO.

Figure 5A:
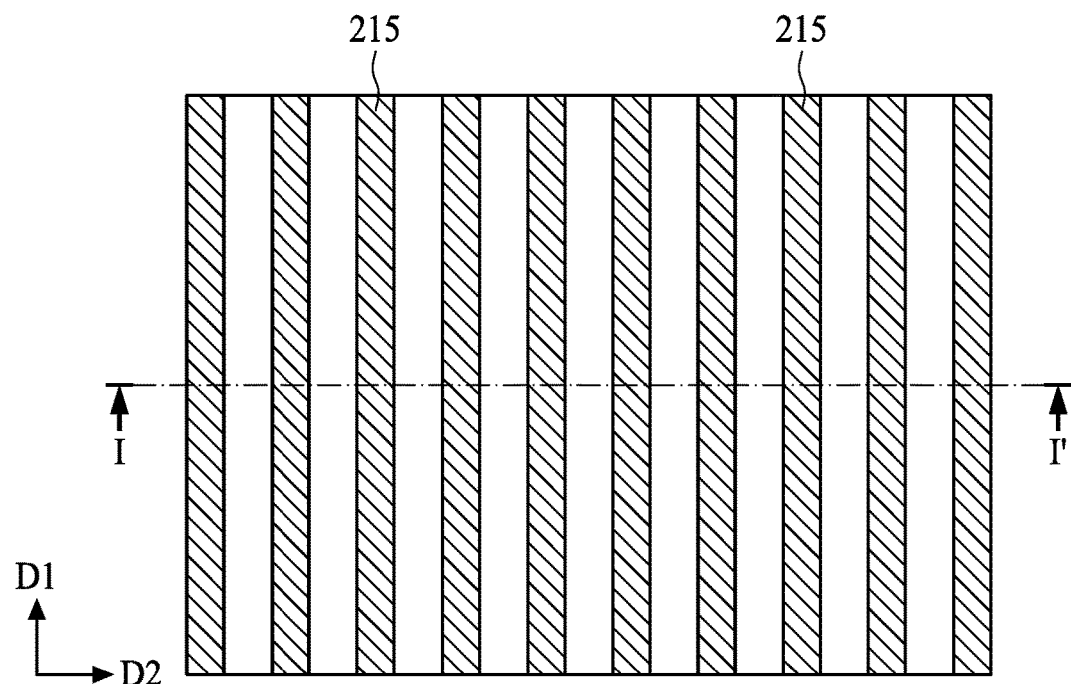
Figure 5B:
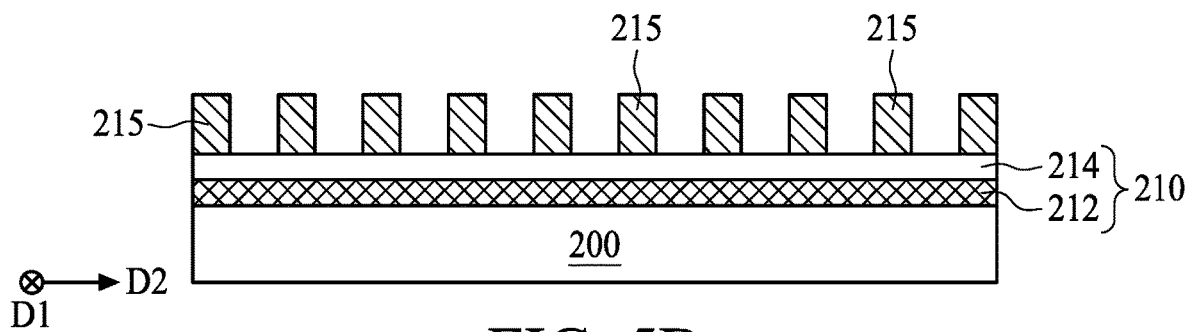

Referring to FIGS. 5A and 5B, the core patterns 220 are removed, and thus a plurality of third mask 215 are formed over the mask stack 210, according to step 108. As shown in FIGS. 5A and 5B, the third masks 215 extend along the first direction D1, and portions of the second mask 214 of the mask stack 210 are exposed through the third masks 215.

Figure 6A:
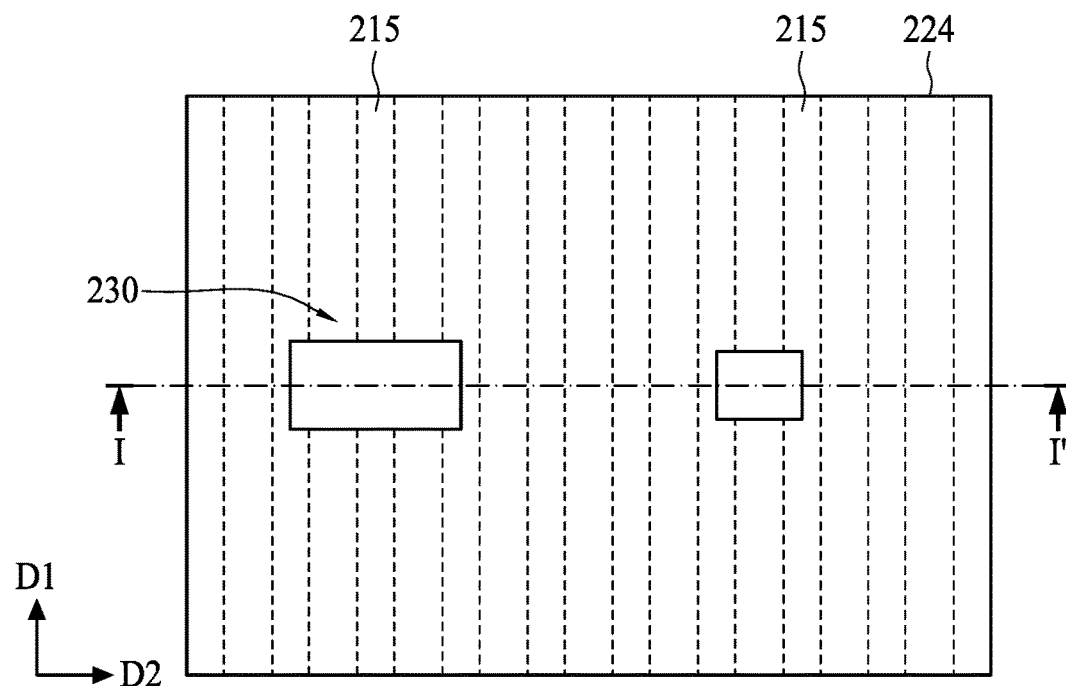
Figure 6B:
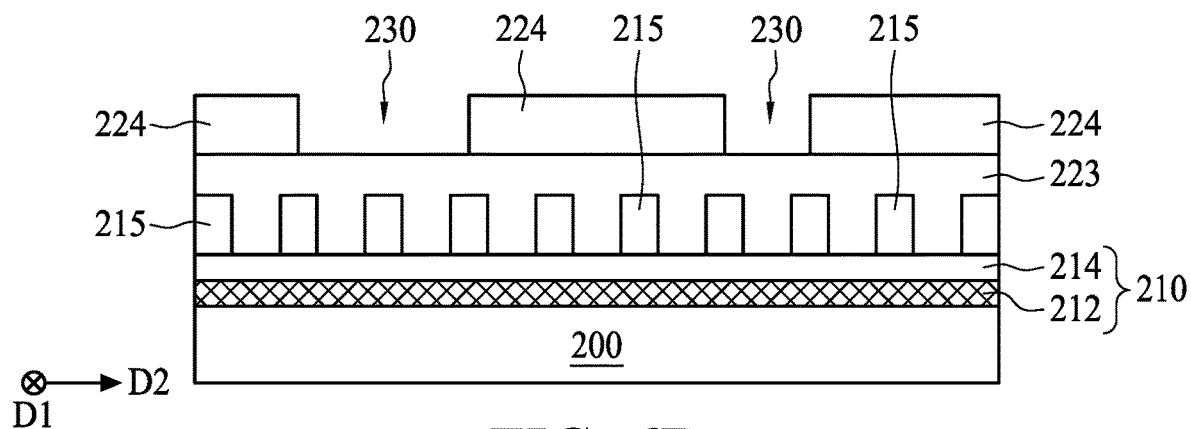

Referring to FIGS. 6A and 6B, a sacrificial layer 223 is formed over the third masks 215 and the mask stack 210. As shown in FIG. 6B, the sacrificial layer 223 fills spaces between the third masks 215, and thus a substantially even and flat top surface is obtained over the substrate 200. In some embodiments, the sacrificial layer 223 can be formed by spin-on coating. In other embodiments, the sacrificial layer 223 can be formed by other types of deposition, but the disclosure is not limited thereto. In some embodiments, the sacrificial layer 223 can include organic materials, but the disclosure is not limited thereto. A patterned layer 224 is then formed over the sacrificial layer 223 and the third masks 215 according to step 110. Further, the patterned layer 224 includes a plurality of first openings 230, as shown in FIGS. 6A and 6B. In some embodiments, the patterned layer 224 includes photoresist, but the disclosure is not limited thereto. In some embodiments, the first openings 230 extend along a second direction D2, as shown in FIGS. 6A and 6B. The second direction D2 is different from the first direction D1. In some embodiments, the first direction D1 and the second direction D2 are perpendicular to each other, but the disclosure is not limited thereto.

Figure 7A:
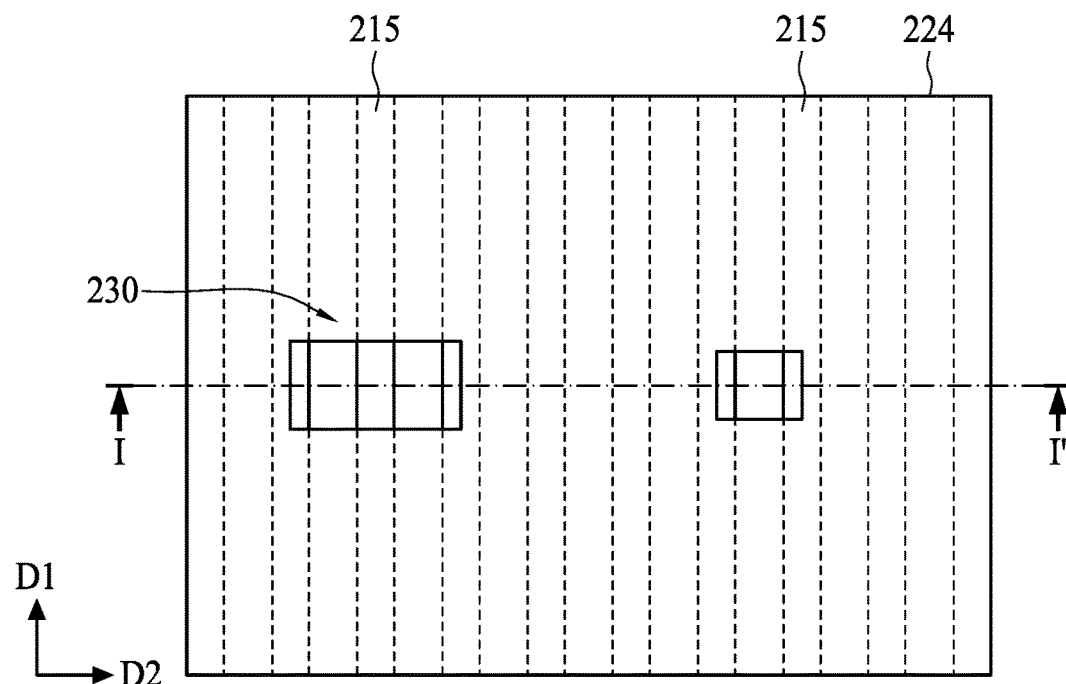
Figure 7B:
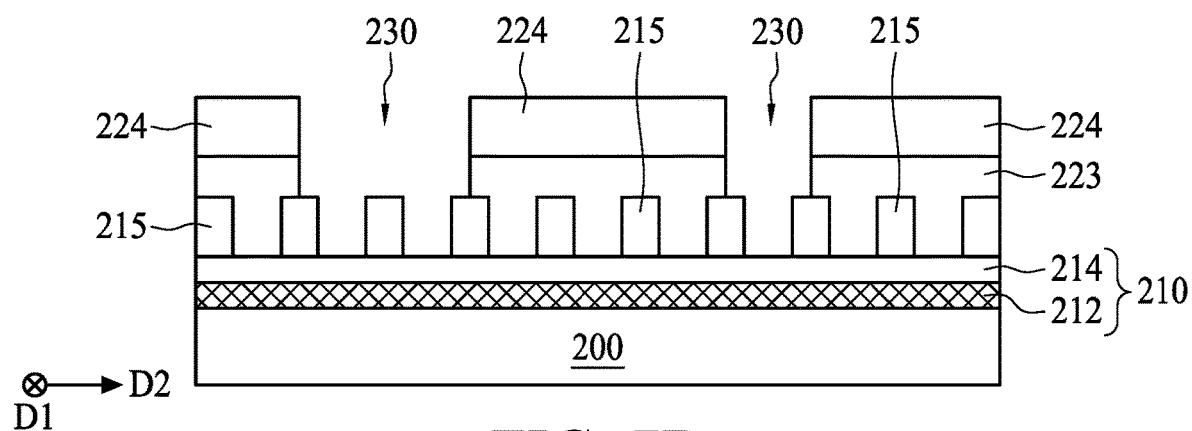

Referring to FIGS. 7A and 7B, in some embodiments, the first openings 230 in the patterned layer 224 are transferred or extended into the sacrificial layer 223, and thus portions of the third masks 215 and portions of the second mask 214 are exposed through the first openings 230. Therefore, in some embodiments, the patterned layer is referred to as a multi-layered structure that includes the patterned photoresist 224 and the patterned sacrificial layer 223. Additionally, the first openings 230 can include different dimensions, as shown in FIGS. 7A and 7B. It should be noted that in the first embodiment, the portions of the second mask 214 exposed though the first openings 230 and through the third masks 215 can be referred to as first portions.

Figure 8A:
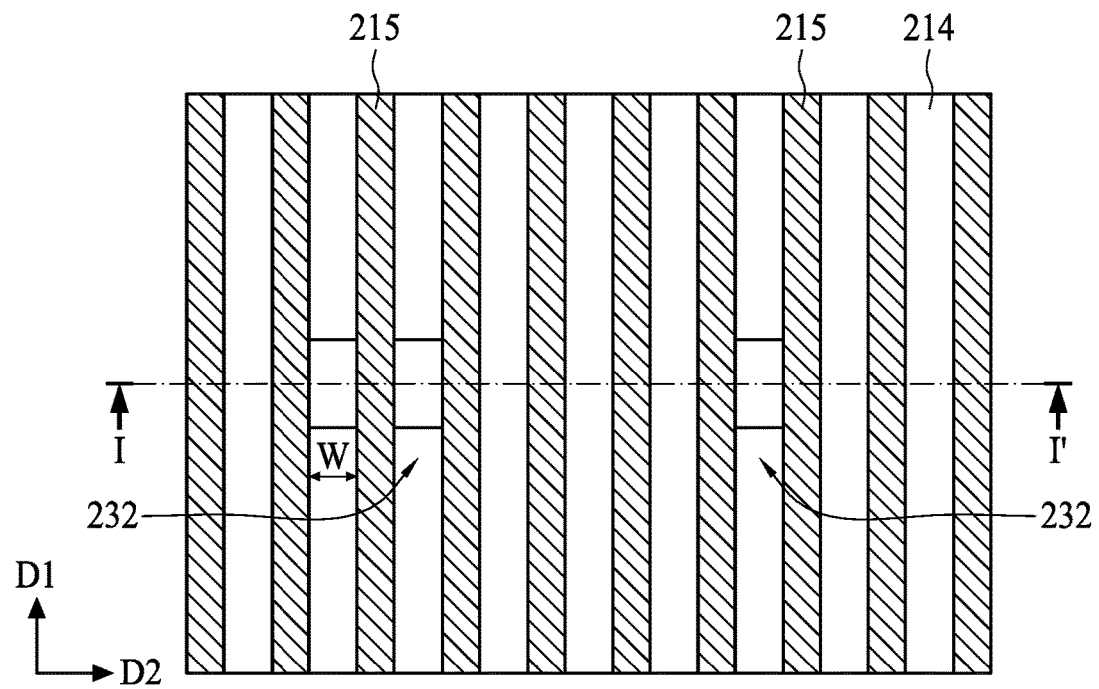
Figure 8B:
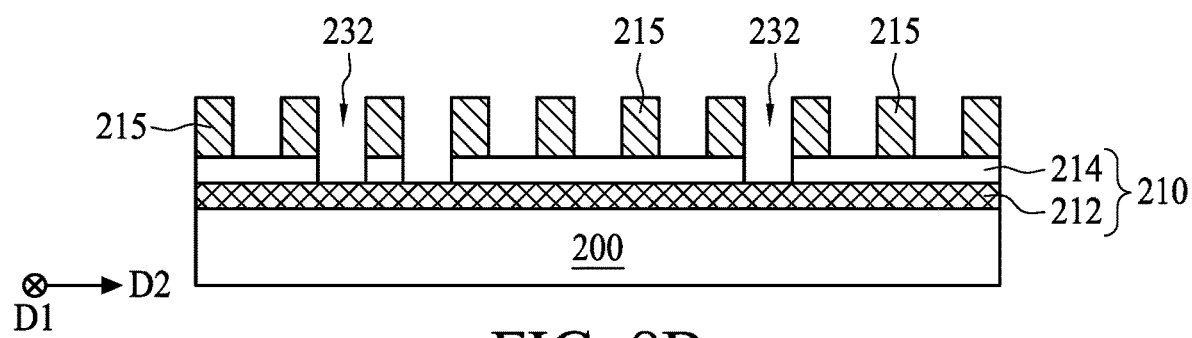

Referring to FIGS. 8A and 8B, the first portions of the second mask 214 are removed through the first openings 230 and through the third masks 215, according to step 112. Consequently, a plurality of second openings 232 are formed in the second mask 214, as shown in FIGS. 8A and 8B. Significantly, portions of the first mask 212 are exposed through the second openings 232. In some embodiments, a width W of the second openings 232 can be the same, but the disclosure is not limited thereto. Further, in the first embodiment, the width W of the second openings 232 is less than a width of the first openings 230. Additionally, the patterned layer 224 and the sacrificial layer 223 can be removed after the forming of the second openings 232, but the disclosure is not limited thereto.

Figure 9A:
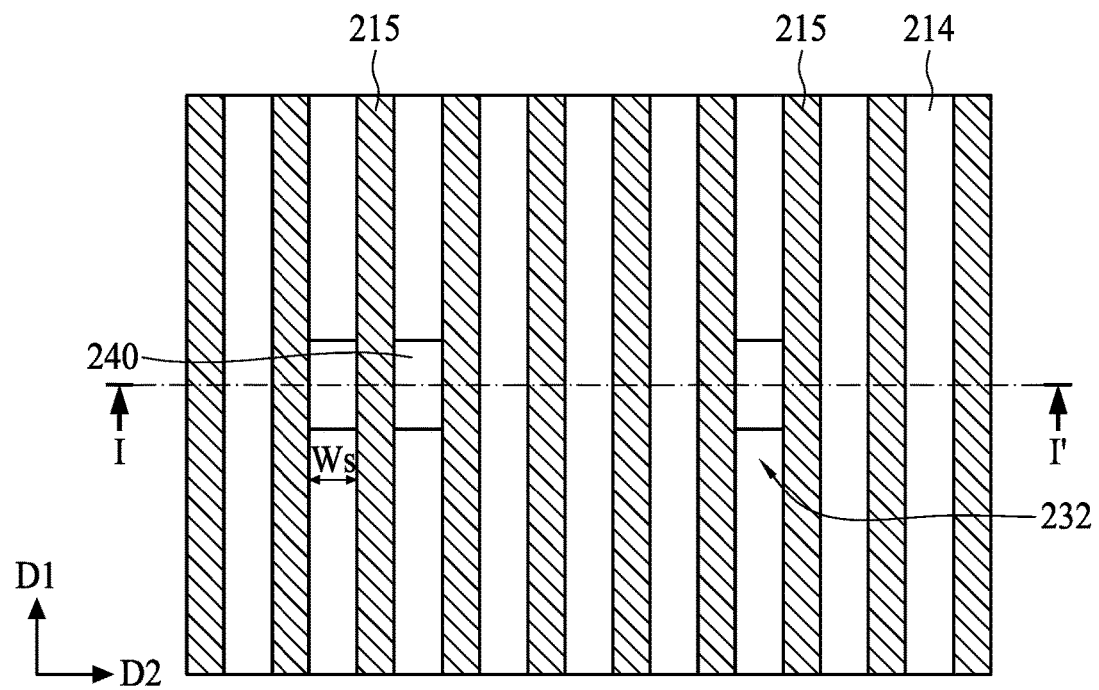
Figure 9B:
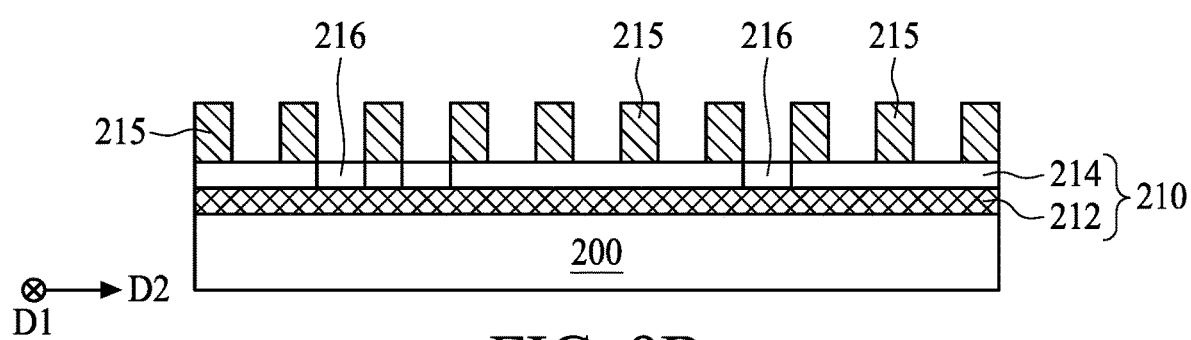

Referring to FIGS. 9A and 9B, a plurality of self-aligned protecting structures 216 are formed according to step 114. As shown in FIGS. 9A and 9B, each of the self-aligned protecting structures 216 is formed in one second opening 232, respectively. In the first embodiment, a width Ws of self-aligned protecting structures 216 can be the same, but the disclosure is not limited thereto. In some embodiments, the patterned layer 224 and the sacrificial layer 223 can be removed after the forming of self-aligned protecting structures 216, but the disclosure is not limited thereto. A top surface of each self-aligned protecting structure 216 can be coplanar with or higher than a top surface of the second mask 214.

In some embodiments, the self-aligned protecting structures 216 are formed by selective ALD process or selective epitaxial growth (SEG). It should be noted that the materials used to form the self-aligned protecting structures 216 depend on the materials used to form the first mask 212. Accordingly, in the selective ALD process, the self-aligned protecting structures 216 are formed only on the surface of the first mask 212 exposed through the second openings 232, and thus the protecting structures 216 are "self-aligned" with the second openings 232. For example, in some embodiments when the first mask 212 includes semiconductor material such as polysilicon or amorphous silicon, the self-aligned protecting structures 216 can include metal oxide such as TiO or hafnium oxide mask (HfO). In some other embodiments when the first mask 212 includes metal or metal nitride such as Ti or TiN, the protecting structures 216 can include metal such as cobalt (Co) or ruthenium (Ru), but the disclosure is not limited thereto. In other embodiments, when the first mask 212 includes polysilicon, the protecting structures 216 can include epitaxial materials, such as epitaxial silicon or epitaxial silicon germanium (SiGe), but the disclosure is not limited thereto. In the SEG process, the epitaxial self-aligned protecting structures 216 are formed only on the surface of the first mask 212 exposed through the second openings 232, and thus the protecting structures 216 are "self-aligned" with the second openings 232. Consequently, the portions of the first mask 212 previously exposed through the second openings 232 are now covered by the self-aligned protecting structures 216, as shown in FIGS. 9A and 9B. In some embodiments, other portions of the second mask 214 are exposed through the third masks 215 after the removal of the patterned layer 224 and the sacrificial layer 223. In some embodiments, the portions of the second mask 214 exposed through the third masks 215 after the removal of the patterned layer 224 and the sacrificial layer 223 are defined as second portions of the second mask 214.

Figure 10A:
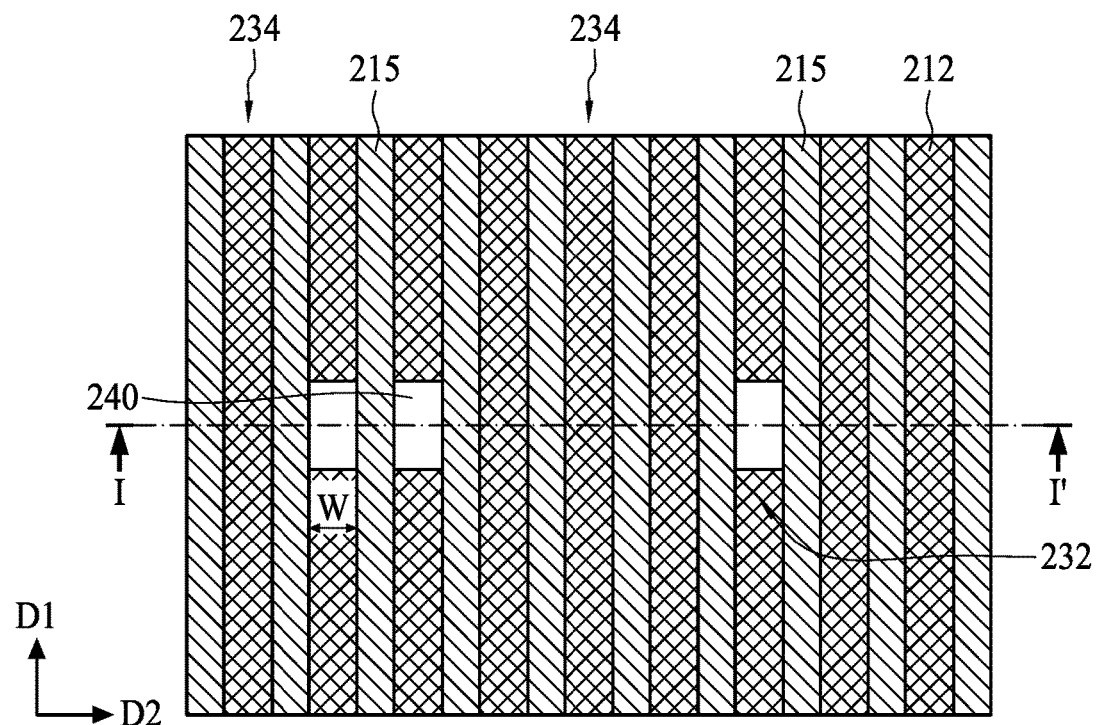
Figure 10B:
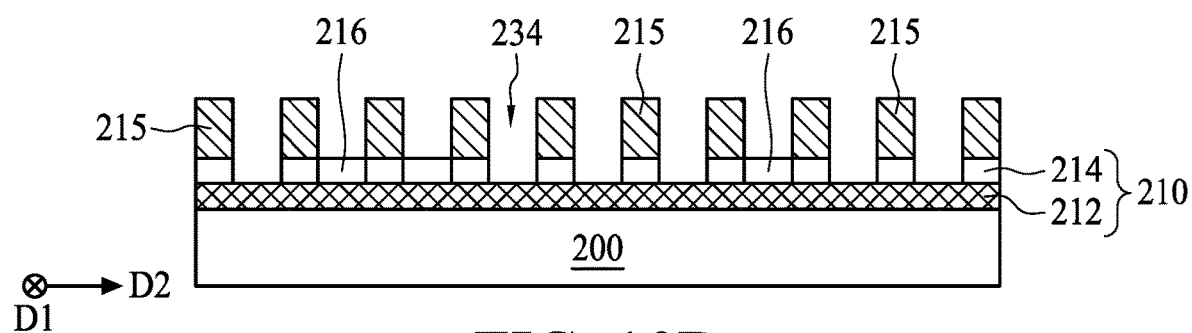

Referring to FIGS. 10A and 10B, the second portions of the second mask 214 are removed according to step 116. Consequently, a plurality of third openings 234 are formed in the second mask 214. Further, portions of the first mask 212 are exposed through the third openings 234, as shown in FIGS. 10A and 10B. In some embodiments, the third masks 215 can be removed after the forming of the third openings 234.

Figure 11A:
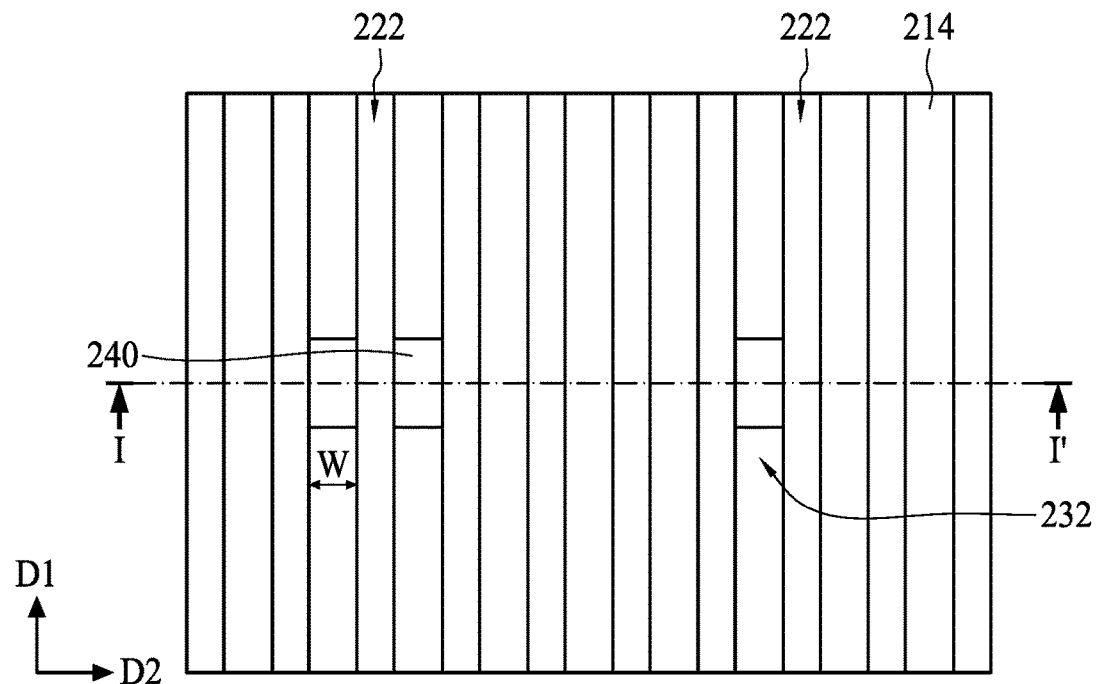
Figure 11B:
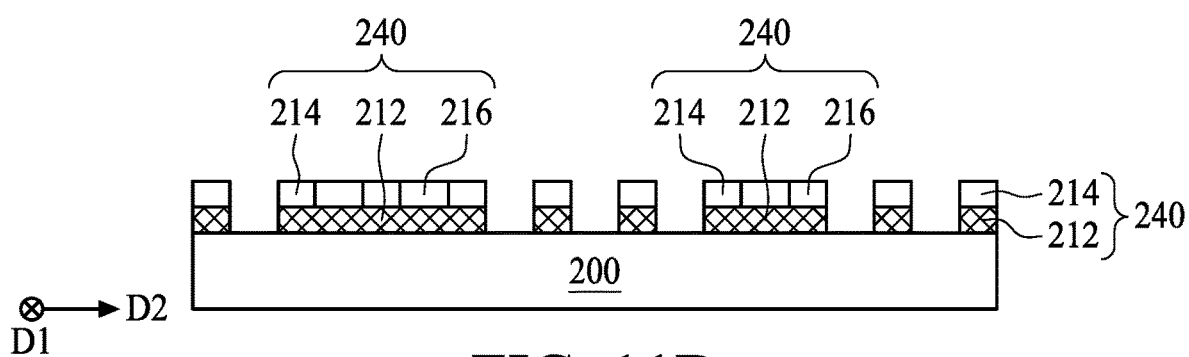

Referring to FIGS. 11A and 11B, the portions of the first mask 212 exposed through the third openings 234 are removed, according to step 118. Accordingly, a hybrid hard mask 240 is formed, and portions of the target layer or substrate 200 are exposed through the hybrid hard mask 240. In some embodiments, the third masks 215 can be removed after the forming of the hybrid hard mask 240. In some embodiments, the hybrid hard mask 240 includes the first mask 212 and the second mask 214. In those embodiments, the first mask 212 forms a base of the hybrid hard mask 240 while the second mask 214 disposed on the first mask 212 forms a top of the hybrid hard mask 240, as shown in the rightmost hybrid hard mask 240 in FIGS. 11A and 11B. In some embodiments, the hybrid hard mask 240 includes the first mask 212, one self-aligned protecting structure 216 and the second mask 214. In those embodiments, the first mask 212 forms a base of the hybrid hard mask 240, while the second mask 214 and the self-aligned protecting structure 216 disposed on the first mask 212 forms a top of the hybrid hard mask 240. Further, the self-aligned protecting structure 216 is sandwiched between portions of the second mask 214, as shown in the hybrid hard mask 240 in the middle of FIG. 11B. In other embodiments, the hybrid hard mask 240 includes the first mask 212, more than one self-aligned protecting structure 216 (e.g., two self-aligned protecting structures 216) and the second mask 214. In those embodiments, the first mask 212 forms a base of the hybrid hard mask 240, while the second mask 214 and the two self-aligned protecting structures 216 disposed on the first mask 212 form a top of the hybrid hard mask 240. Further, the self-aligned protecting structures 216 are respectively sandwiched between portions of the second mask 214, as shown in the leftmost hybrid hard mask 240 of FIG. 11B.

Figure 12A:
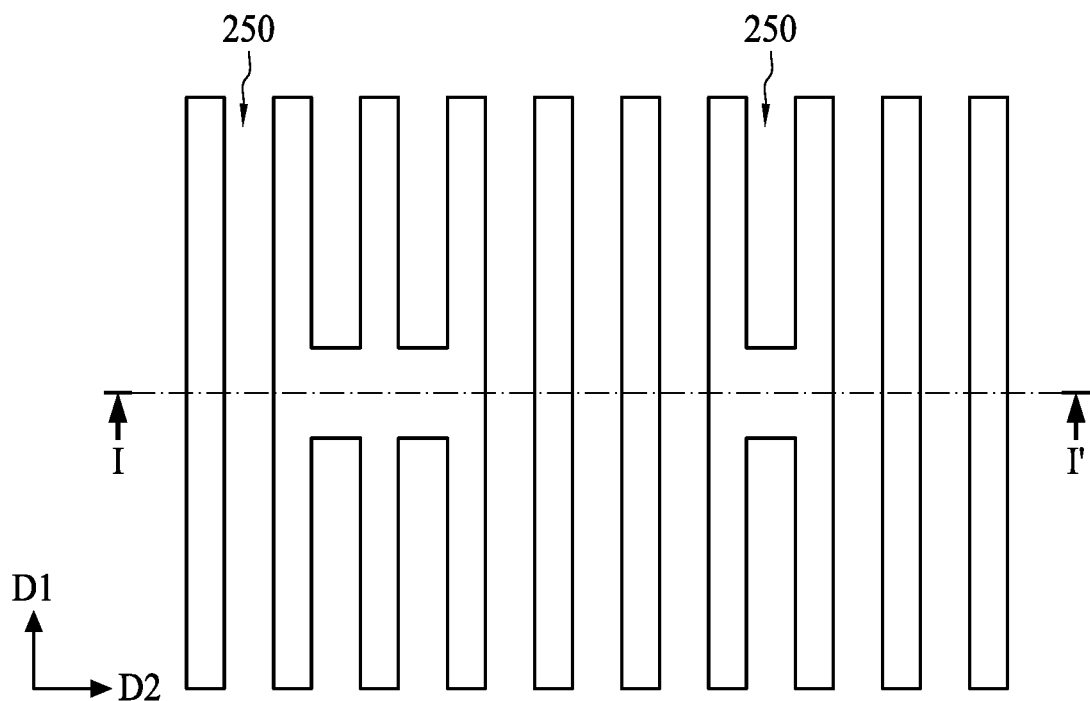
Figure 12B:
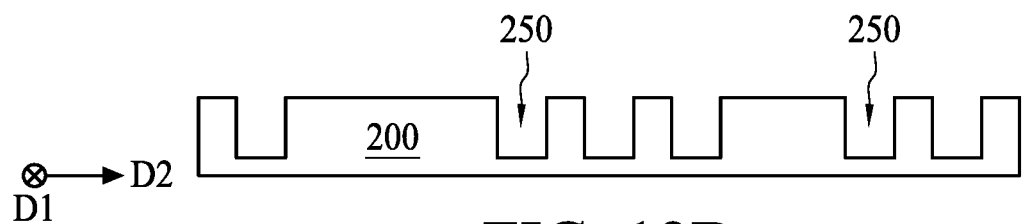

Referring to FIGS. 12A and 12B, the substrate or the target layer 200 is etched through the hybrid hard mask 240 according to step 120. Accordingly, a plurality of recesses 250 are formed in the substrate or the target layer 200. Significantly, the recesses 250 are separate from each other, as shown in FIGS. 12A and 12B. In some embodiments, the hybrid hard mask 240 can be removed after the forming of the recesses 250, but the disclosure is not limited thereto.

Figure 13A:
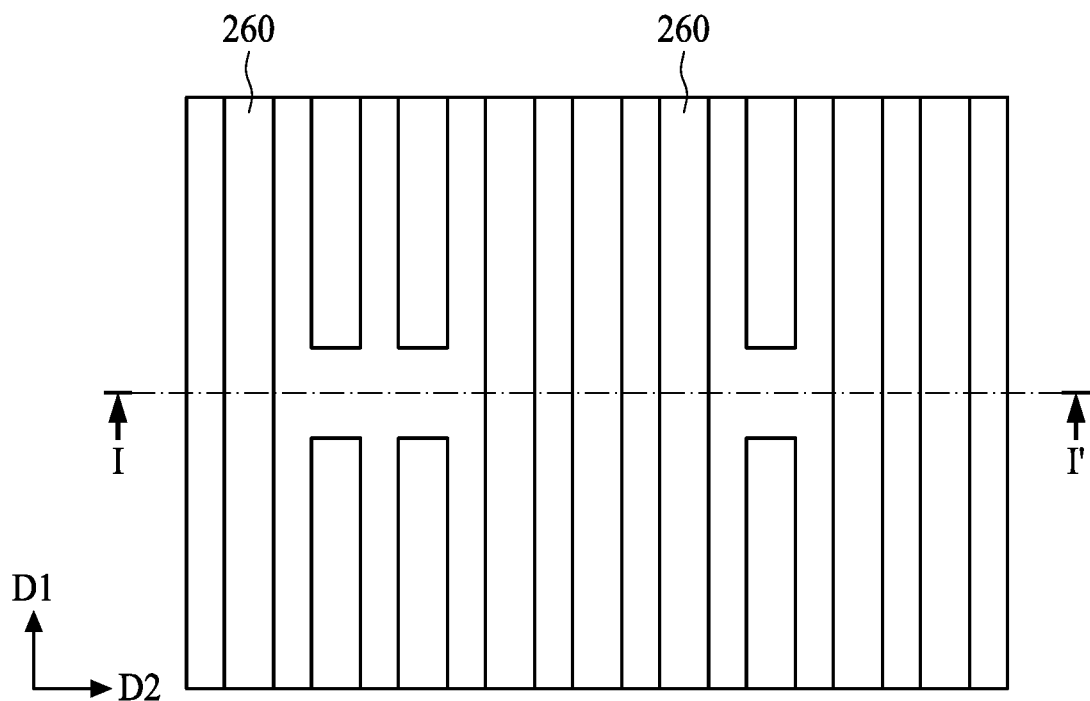
Figure 13B:
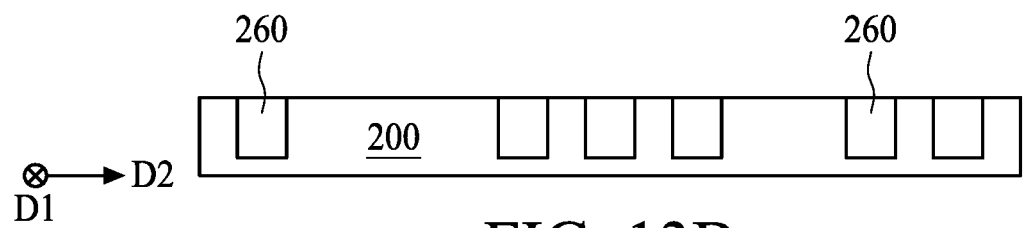

Referring to FIGS. 13A and 13B, in some embodiments, the method 10 further includes a step of forming a conductive layer to fill the plurality of recesses 250. Further, a planarization process such as a CMP process can be performed to remove superfluous conductive layers from the substrate 200, and thus to form a plurality of conductive lines 260 filling the recesses in the substrate or the target layer 200. Additionally, top surfaces of the conductive lines 260 and top surface of the substrate or the target layer 200 are substantially coplanar. It should be noted that since the conductive lines 260 are formed in the recesses 250, which are separate from each other, the conductive lines 260 are also separate from each other.

FIGS. 14A, 15A, 16A, 17A and 18A are schematic diagrams illustrating fabrication stages constructed according to the method for preparing the semiconductor structure in accordance with a second embodiment of the present disclosure. FIGS. 14B, 15B, 16B, 17B and 18B are cross-sectional views taken along line I-I' of FIGS. 14A, 15A, 16A, 17A and 18A, respectively. It should be understood that similar features in FIGS. 2A to 13B and 14A to 18B are identified by the same reference numerals for clarity and simplicity. Furthermore, similar elements in FIGS. 2A to 13B and 14A to 18B can include similar materials, and thus descriptions of such details are omitted in the interest of brevity.

Figure 14A:
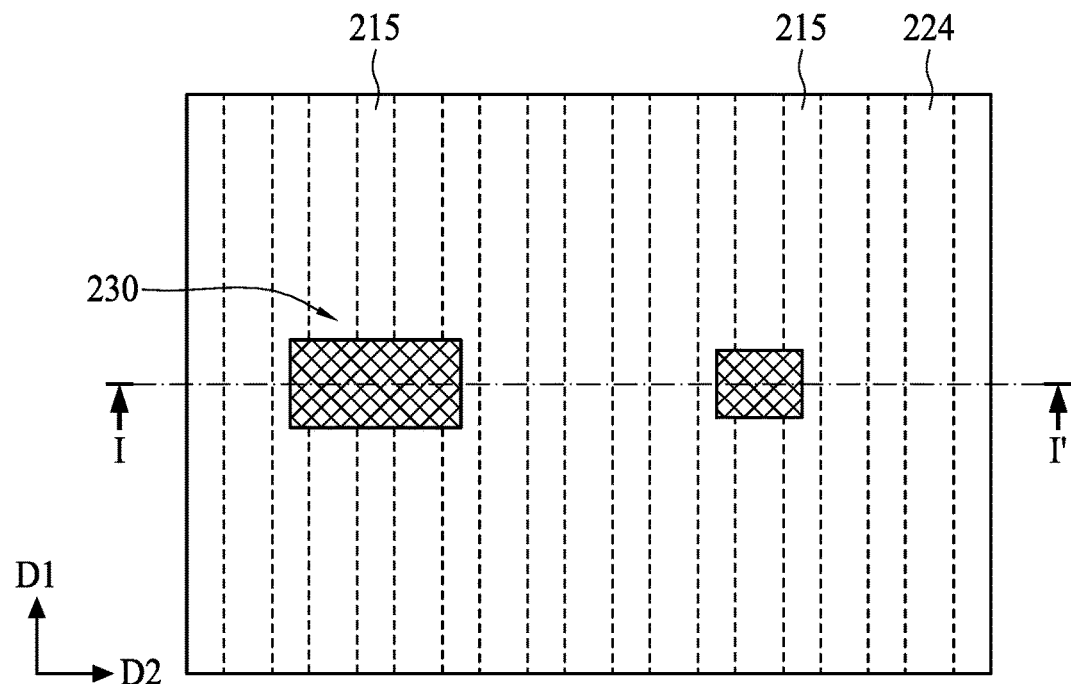
FIGS. 14A, 15A, 16A, 17A and 18A are schematic diagrams illustrating fabrication stages constructed according to the method for preparing the semiconductor structure in accordance with a second embodiment of the present disclosure.
Figure 14B:
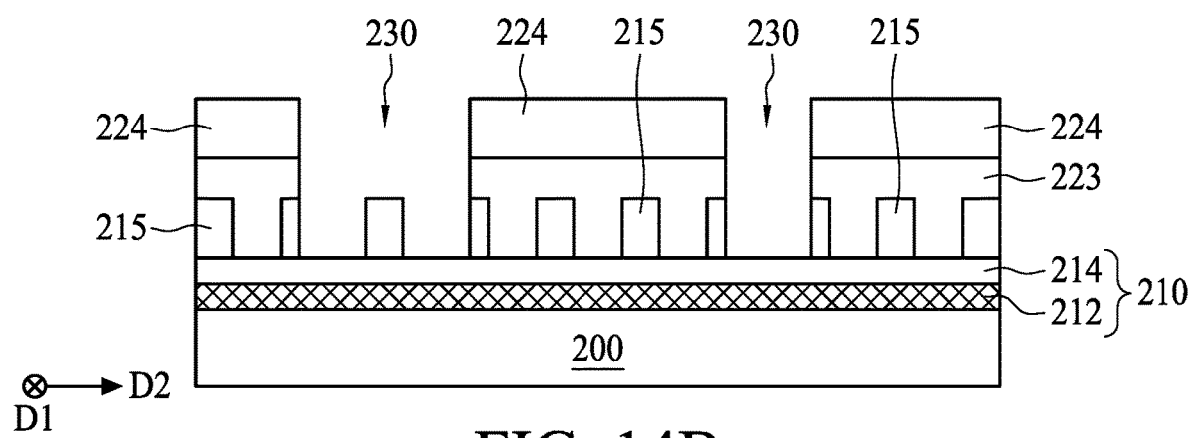
FIGS. 14B, 15B, 16B, 17B and 18B are cross-sectional views taken along line I-I' of FIGS. 14A, 15A, 16A, 17A and 18A, respectively.

In the second embodiment, a substrate or a target layer 200 is provided, and mask stack 210 is formed on the substrate or the target layer 200 according to step 102. As mentioned above, the mask stack 210 may include a first mask 212 and a second mask 214. A plurality of core patterns (as shown in FIGS. 3A and 3B) are formed over the mask stack 210 according to step 104. A plurality of spacers (as shown in FIGS. 4A and 4B) are formed over sidewalls of each core pattern according to step 106. Subsequently, the core patterns are removed to form a plurality of third masks 215 over the mask stack 210 according to step 108. As shown in FIGS. 14A and 14B, the third masks 215 extend along a first direction D1.

Referring to FIGS. 14A and 14B, a sacrificial layer 223 is formed over the third masks 215 and the mask stack 210. As mentioned above, the sacrificial layer 223 fills spaces between the third masks 215, and thus a substantially even and flat top surface is obtained over the substrate 200. A patterned layer 224 is then formed over the sacrificial layer 223 and the third masks 215 according to step 110. Further, the patterned layer 224 includes a plurality of first openings 230, as shown in FIGS. 14A and 14B. In some embodiments, the first openings 230 extend along a second direction D2, as shown in FIGS. 14A and 14B. The second direction D2 is different from the first direction D1. In some embodiments, the first direction D1 and the second direction D2 are perpendicular to each other, but the disclosure is not limited thereto.

In some embodiments, the first openings 230 in the patterned layer 224 are transferred or extended into the sacrificial layer 223, and thus portions of the third masks 215 and portions of the second mask 214 are exposed through the first openings 230. Additionally, the portions of the second mask 214 exposed though the first openings 230 and the third masks 215 can be defined as first portions.

Figure 15A:
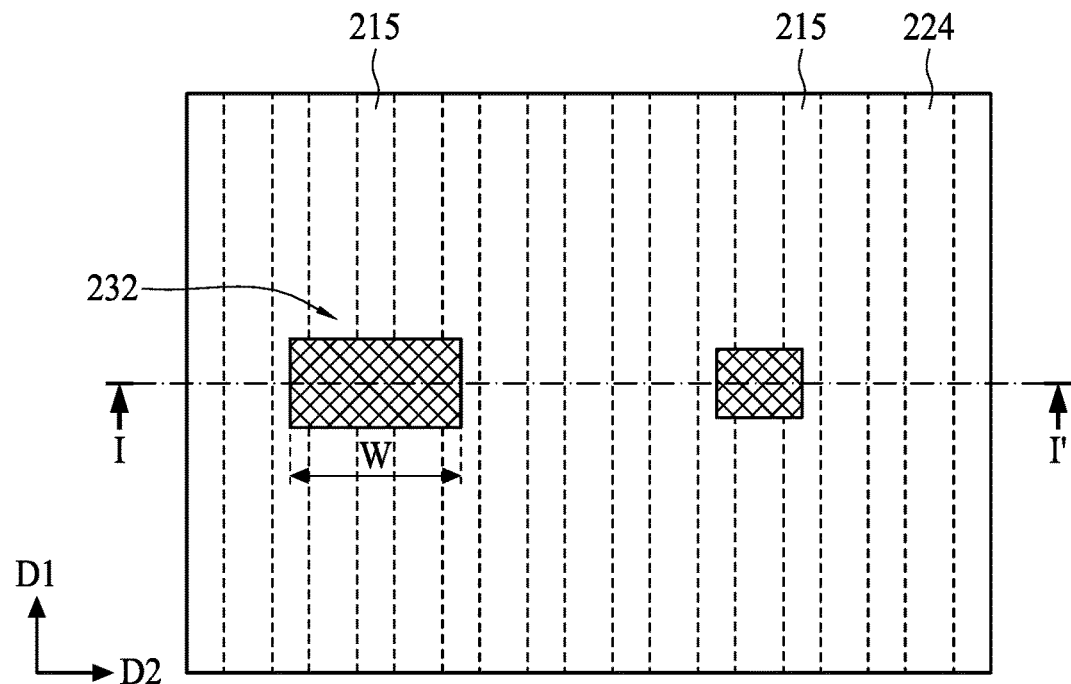
Figure 15B:
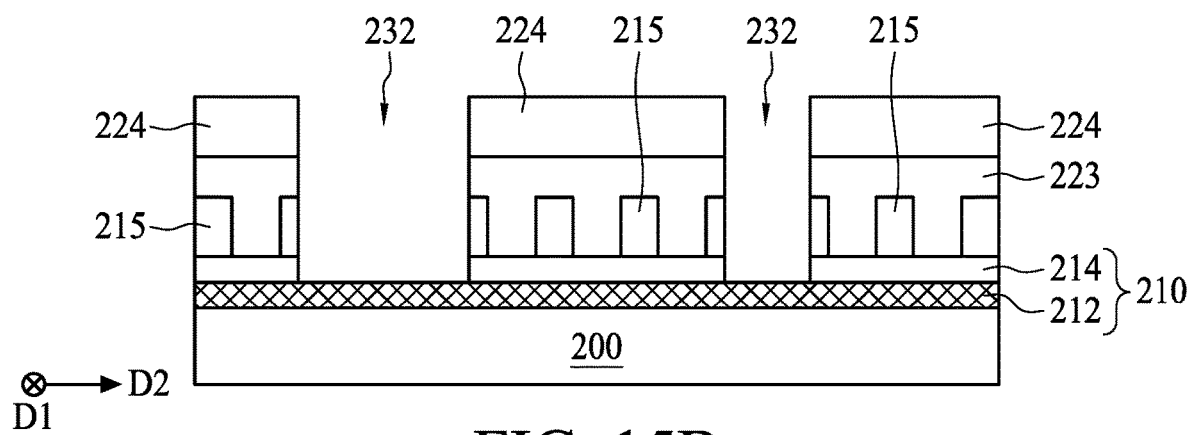

Referring to FIGS. 15A and 15B, the first portions of the second mask 214 are removed through the first openings 230 and through the third masks 215, according to step 112. It should be noted that in the second embodiment, the portions of the third masks 215 exposed through the first openings 230 are also removed in step 112. In other words, the first portions of the second mask 214 and the exposed portions of the third masks 215 are removed through the first openings 230. Consequently, a plurality of second openings 232 are formed in the second mask 214, as shown in FIGS. 15A and 15B. Further, the second openings 232 are formed corresponding to the first openings 230. In the second embodiment, a width W of the second openings 232 can be the same as a width of the first openings 230. Significantly, portions of the first mask 212 are exposed through the second openings 232.

Figure 16A:
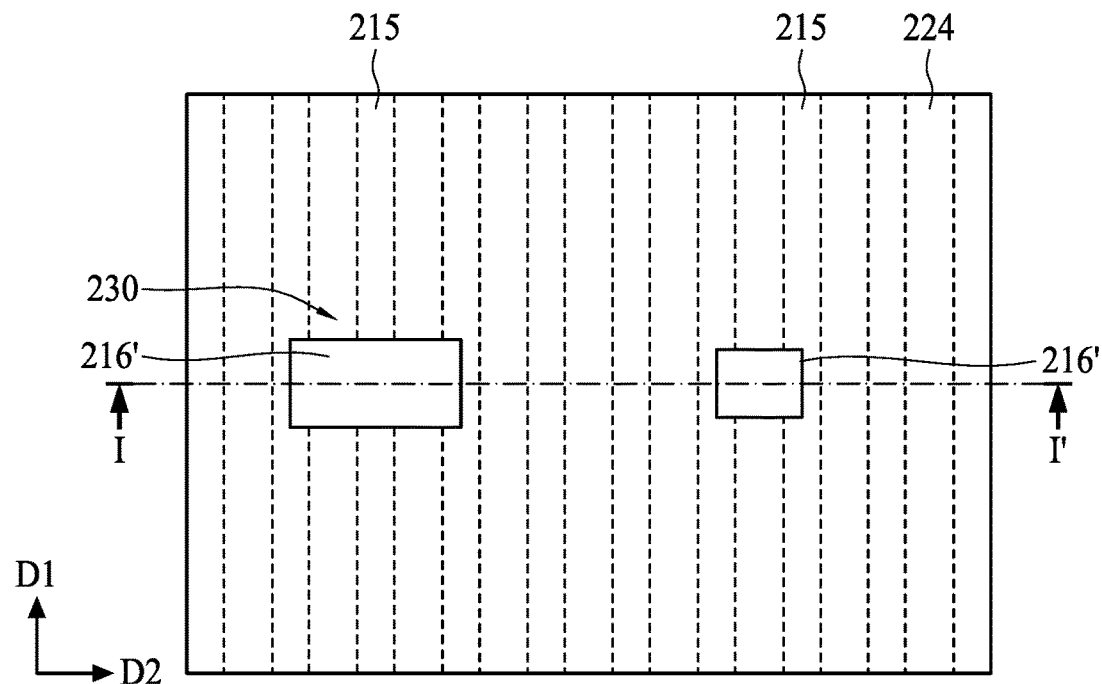
Figure 16B:
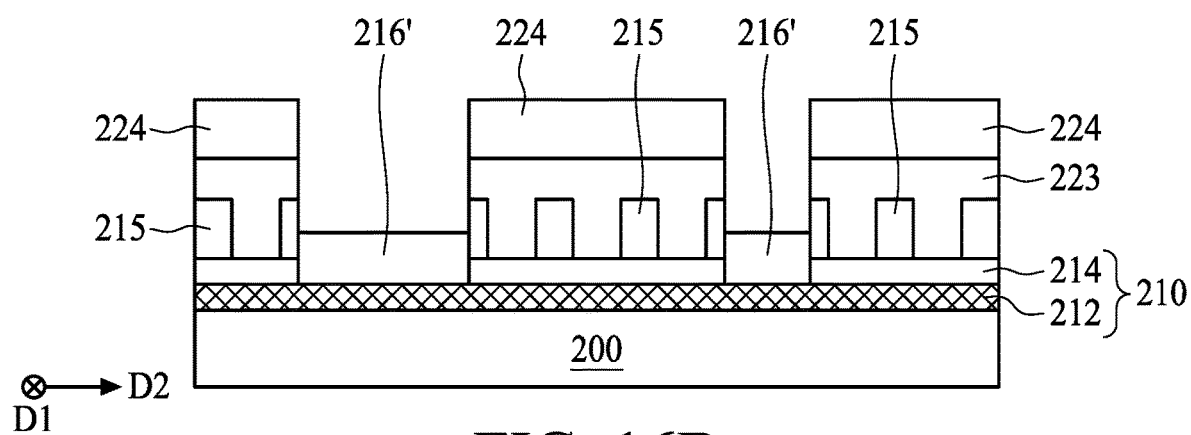

Referring to FIGS. 16A and 16B, a plurality of self-aligned protecting structures 216' are formed according to step 114. As shown in FIGS. 16A and 16B, each of the self-aligned protecting structures 216' is formed in one second opening 232. In some embodiments, the patterned layer 224 and the sacrificial layer 223 can be removed after the forming of self-aligned protecting structures 216', but the disclosure is not limited thereto. A top surface of each self-aligned protecting structure 216' can be coplanar with or higher than a top surface of the second mask 214. As mentioned above, the materials used to form the self-aligned protecting structures 216' depend on the materials used to form the first mask 212, and therefore descriptions of such details are omitted in the interest of brevity. Significantly, in the selective ALD process or SEG process, the self-aligned protecting structures 216' are formed only on the surface of the first mask 212 exposed through the second openings 232, and thus the protecting structures 216' are "self-aligned" with the second openings 232. Consequently, the portions of the first mask 212 previously exposed through the second openings 232 are now covered by the self-aligned protecting structures 216', as shown in FIGS. 16A and 16B. In some embodiments, the patterned layer 224 and the sacrificial layer 223 can be removed after the forming of the second openings 232. In other embodiments, the patterned layer 224 and the sacrificial layer 223 can be removed after the forming of the self-aligned protecting structures 216'.

Figure 17A:
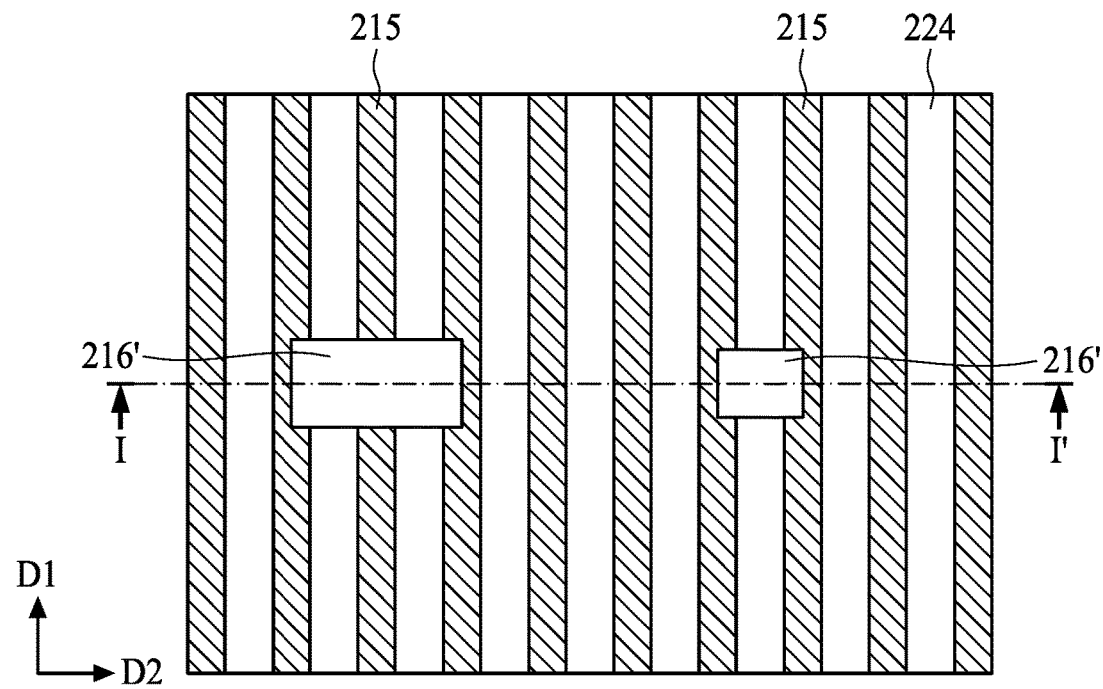
Figure 17B:
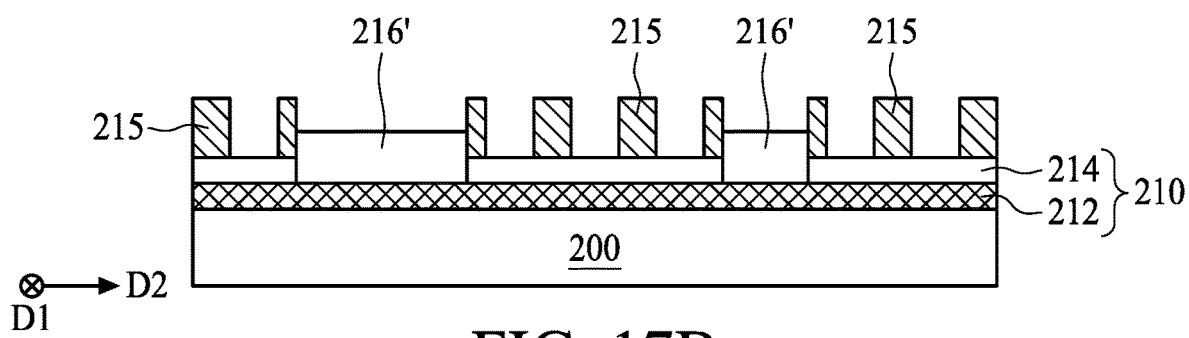

Referring to FIGS. 17A and 17B, after the removal of the patterned layer 224 and the sacrificial layer 223, other portions of the second mask 214 are exposed through the third masks 215, and such portions of the second mask 214 can be defined as second portions of the second mask 214.

Figure 18A:
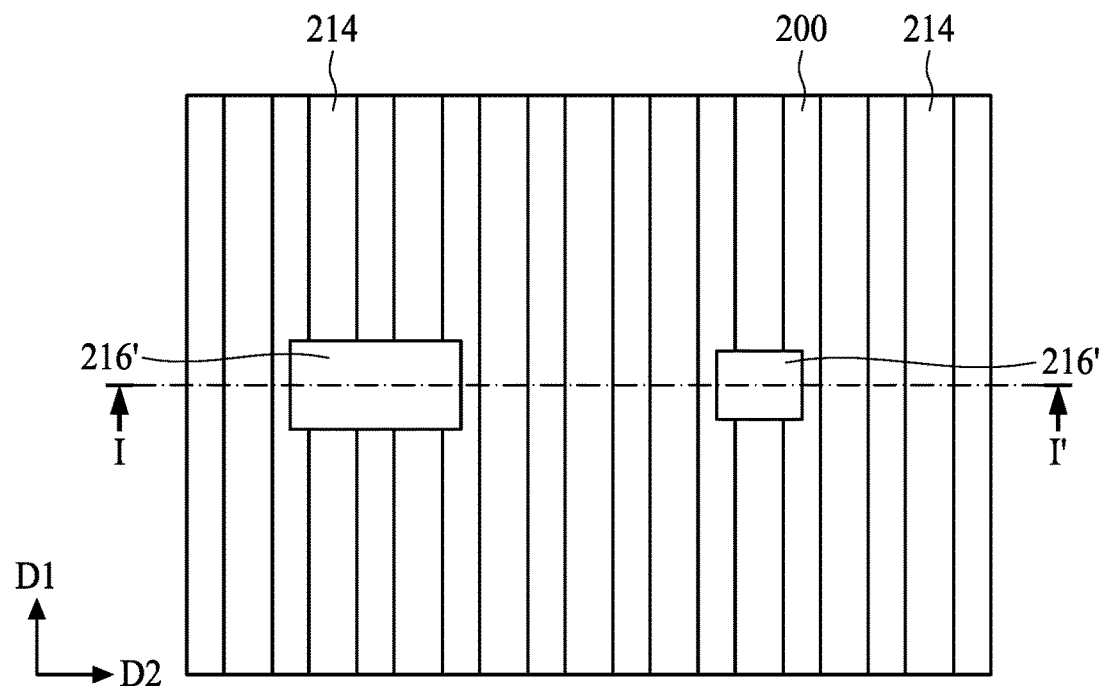
Figure 18B:
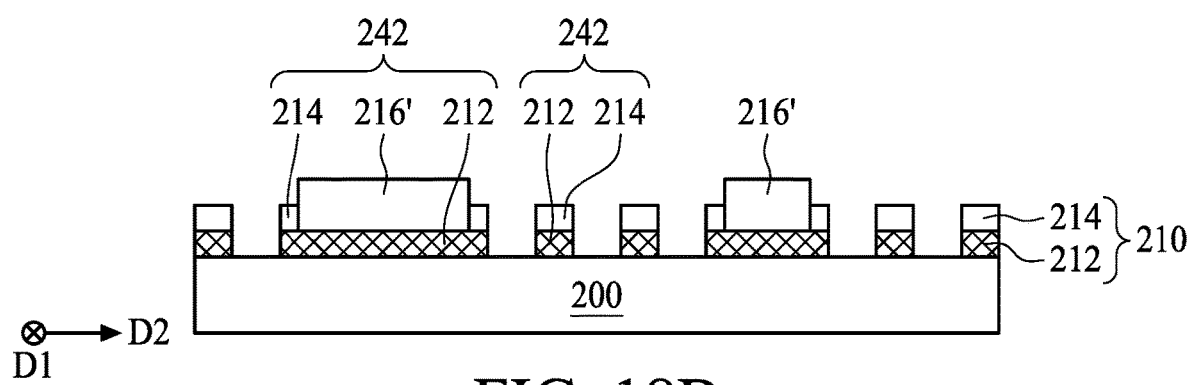

Referring to FIGS. 18A and 18B, the second portions of the second mask 214 are removed according to step 116. Consequently, a plurality of third openings 234 (as shown in FIGS. 10A and 10B) are formed in the second mask 214. Further, portions of the first mask 212 are exposed through the third openings. In some embodiments, the third masks 215 can be removed after the forming of the third openings. Next, the portions of the first mask 212 exposed through the third openings are removed, according to step 118. Accordingly, a hybrid hard mask 242 is formed, and portions of the target layer or substrate 200 are exposed through the hybrid hard mask 242. In some embodiments, the third masks 215 can be removed after the forming of the hybrid hard mask 242. In some embodiments, the hybrid hard mask 242 includes the first mask 212 and the second mask 214. In those embodiments, the first mask 212 forms a base of the hybrid hard mask 242 while the second mask 214 disposed on the first mask 212 forms a top of the hybrid hard mask 242. In some embodiments, the hybrid hard mask 242 includes the first mask 212, one self-aligned protecting structure 216' and the second mask 214. In those embodiments, the first mask 212 forms a base of the hybrid hard mask 242, while the second mask 214 and the self-aligned protecting structure 216' disposed on the first mask 212 forms a top of the hybrid hard mask 242. Further, the self-aligned protecting structure 216' is sandwiched between portions of the second mask 214, as shown in FIGS. 18A and 18B.

Next, the substrate or the target layer 200 is etched through the hybrid hard mask 242 according to step 120. Accordingly, a plurality of recesses 250 (as shown in FIGS. 12A and 12B) are formed in the substrate or the target layer 200. Significantly, the recesses are separate from each other. In some embodiments, the hybrid hard mask 242 is removed after the forming of the recesses, but the disclosure is not limited thereto. As mentioned above, the method 10 further includes a step of forming a conductive layer filling the plurality of recesses. Further, a planarization process such as a CMP process can be performed to remove superfluous conductive layers from the substrate 200, and thus to form a plurality of conductive lines 260 (as shown in FIGS. 13A and 13B) filling the recesses in the substrate or the target layer 200.

According to the method 10 provided by the first and second embodiments, by using the hybrid hard masks 240 and 242, the circuit constructed by the conductive lines can be formed without the cutting process. Further, by forming the protecting structures 216 and 216' self-aligned to the second openings 232, alignment for the cutting process can be eliminated. Consequently, the method 10 provided by the first and second embodiments simplifies the process and reduces the process cost.

Figure 19:
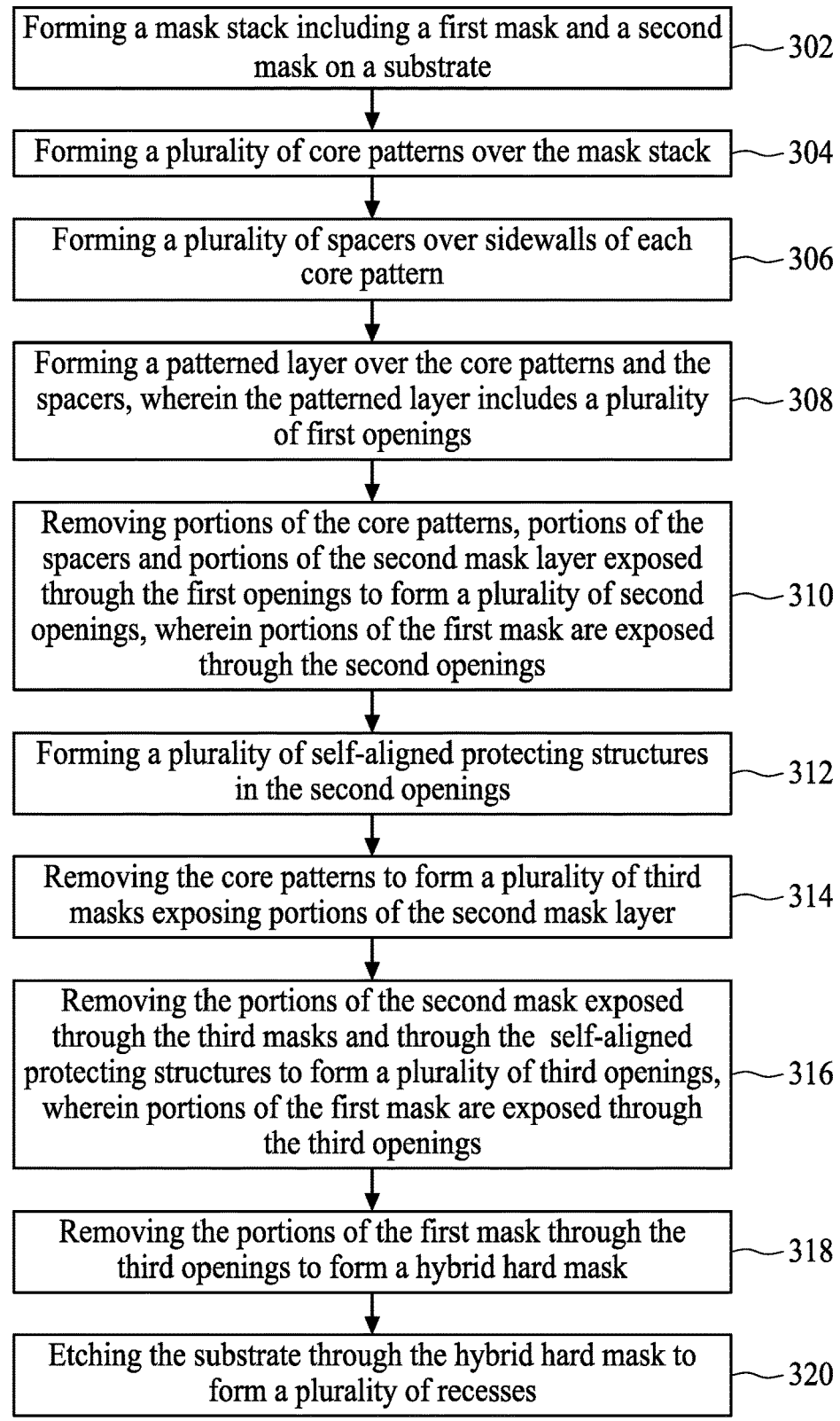
FIG. 19 is a flow diagram illustrating a method for preparing semiconductor structures, in accordance with some embodiments of the present disclosure.

FIG. 19 is a flow diagram illustrating a method for preparing a semiconductor structure in accordance with a third embodiment of the present disclosure. The method for preparing a semiconductor structure 30 includes a step 302, forming a mask stack including a first mask and a second mask on a substrate. The method 30 further includes a step 304, forming a plurality of core patterns over the mask stack. The method 30 further includes a step 306, forming a plurality of spacers over sidewalls of each core pattern. The method 30 further includes a step 308, forming a patterned layer over the core patterns and the spacers. In some embodiments, the patterned layer includes a plurality of first openings. The method 30 further includes a step 310, removing portions of the core patterns, portions of the spacers and portions of the second mask exposed through the first openings to form a plurality of second openings. In some embodiments, portions of the first mask are exposed through the second openings. The method 30 further includes a step 312, forming a plurality of self-aligned protecting structures in the second openings. The method 30 further includes a step 314, removing the core patterns to form a plurality of third masks exposing portions of the second mask. The method 30 further includes a step 316, removing the portions of the second mask exposed through the third masks to form a plurality of third openings. In some embodiments, portions of the first mask are exposed through the third openings. The method 310 further includes a step 318, removing the portions of the first mask through the third openings to form a hybrid hard mask. The method 30 further includes a step 320, etching the substrate through the hybrid hard mask to form a plurality of recesses. The method for preparing the semiconductor structure 30 will be further described according to one or more embodiments below.

FIGS. 20A, 21A, 22A, 23A, 24A, 25A, 26A and 27A are schematic diagrams illustrating fabrication stages constructed according to the method for preparing the semiconductor structure in accordance with the third embodiment of the present disclosure. FIGS. 20B, 21B, 22B, 23B, 24B, 25B, 26B and 27B are cross-sectional views taken along line II-II' of FIGS. 20A, 21A, 22A, 23A, 24A, 25A, 26A and 27A, respectively. FIGS. 21C, 22C, 23C, 24C, 25C, 26C and 27C are cross-sectional views taken along line of FIGS. 21A, 22A, 23A, 24A, 25A, 26A and 27A, respectively. It should be understood that similar features in FIGS. 2A to 13B and 20A to 27C can include similar materials, and thus description of such details are omitted in the interest of brevity.

Figure 20A:
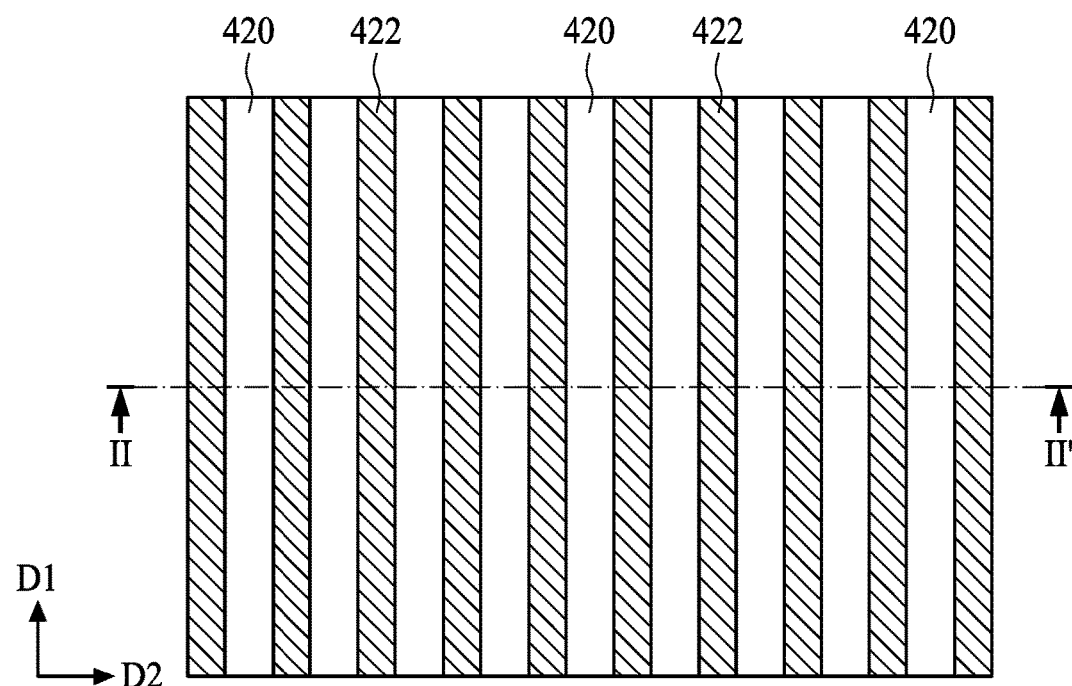
FIGS. 20A, 21A, 22A, 23A, 24A, 25A, 26A and 27A are schematic diagrams illustrating fabrication stages constructed according to the method for preparing the semiconductor structure in accordance with a third embodiment of the present disclosure.
Figure 20B:
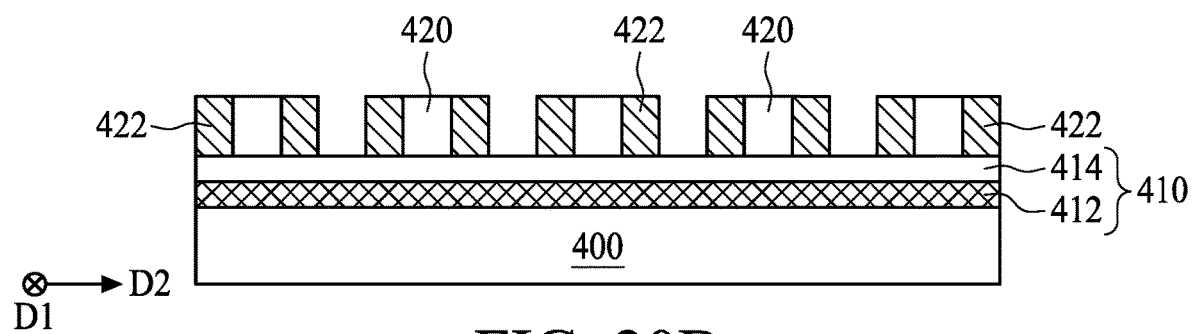
FIGS. 20B, 21B, 22B, 23B, 24B, 25B, 26B and 27B are cross-sectional views taken along line II-II' of FIGS. 20A, 21A, 22A, 23A, 24A, 25A, 26A and 27A, respectively.

Referring to FIGS. 20A and 20B, a substrate 400 is provided. As mentioned above, the substrate 400 can be a target layer, and the target layer can include a dielectric material. A mask stack 410 is formed on the substrate 400 according to step 302. In some embodiments of the present disclosure, the mask stack 410 includes at least a first mask 412 and a second mask 414, as shown in FIG. 20B. The first mask 412 and the second mask 414 can include different materials or materials sufficiently different in composition to allow the second mask 414 to be selectively removable using an appropriate etch chemistry relative to the first mask 412.

Still referring to FIGS. 20A and 20B, a material layer (not shown) is formed and patterned to form a plurality of core patterns 420 over the mask stack 410, according to step 304. The core patterns 420 extend along a first direction D1, as shown in FIGS. 20A and 20B. Subsequently, a plurality of spacers 422 are formed over sidewalls of each core pattern 420, according to step 306. The spacers 422 include materials sufficiently different in composition to allow the core patterns 420 to be selectively removable using an appropriate etch chemistry relative to the spacers 422.

Figure 21A:
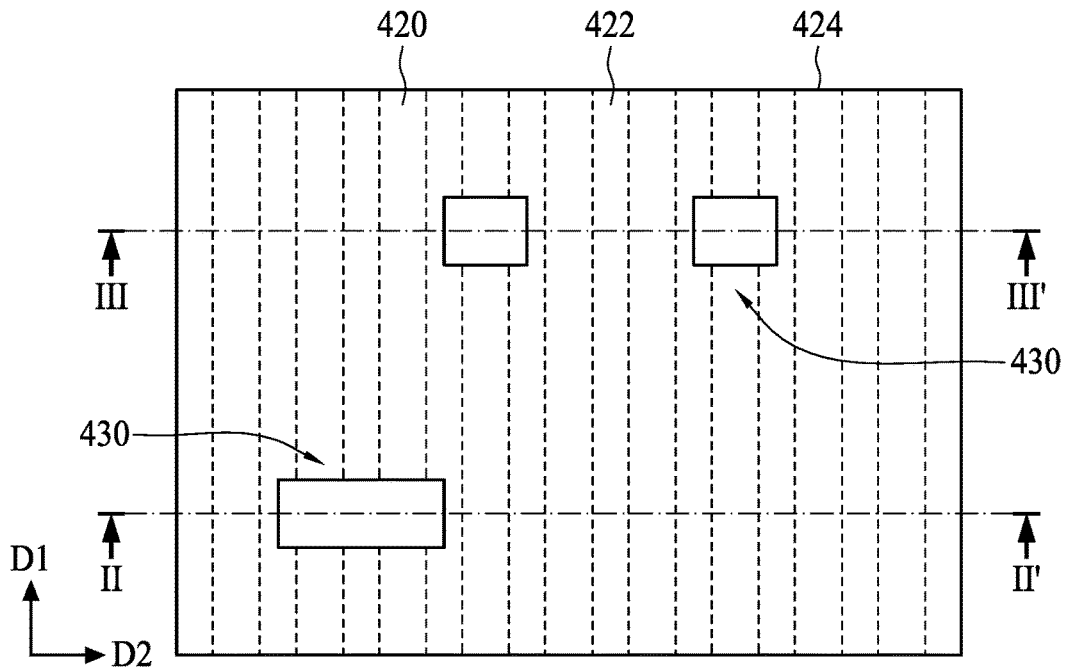
Figure 21B:
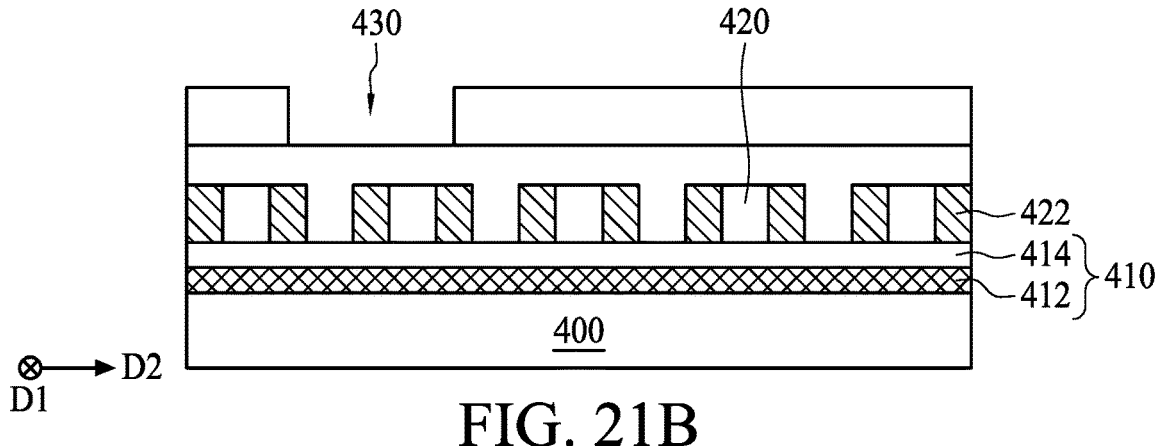
Figure 21C:
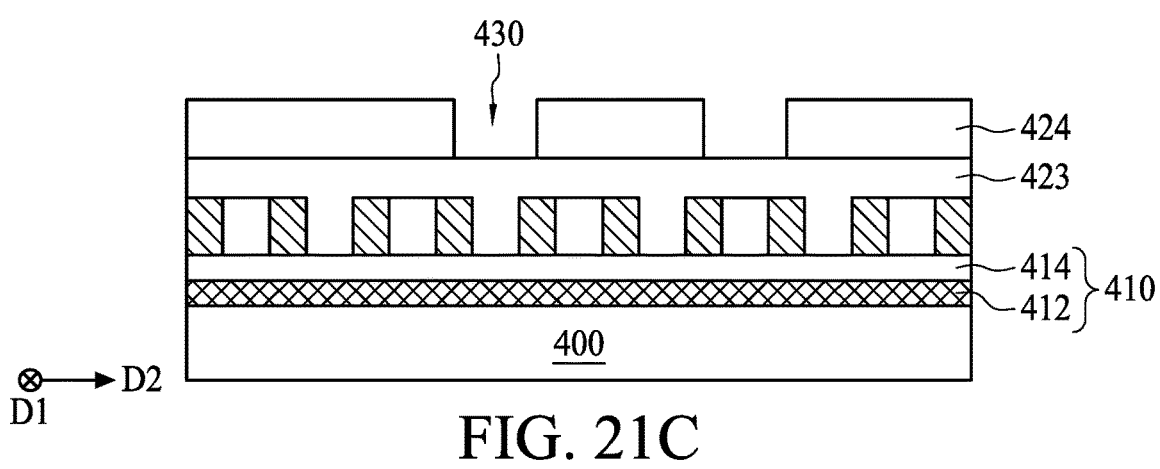
FIGS. 21C, 22C, 23C, 24C, 25C, 26C and 27C are cross-sectional views taken along line of FIGS. 21A, 22A, 23A, 24A, 25A, 26A and 27A, respectively.

Referring to FIGS. 21A, 21B and 21C, a sacrificial layer 423 is formed over the core patterns 420 and the spacers 422. As shown in FIGS. 21B and 21C, the sacrificial layer 423 fills spaces and thus a substantially even and flat top surface is obtained over the substrate 400. A patterned layer 424 is then formed over the sacrificial layer 423, the core patterns 420 and the spacers 422 according to step 308. Further, the patterned layer 424 includes a plurality of first openings 430, as shown in FIGS. 21A, 21B and 21C. In some embodiments, the first openings 430 extend along a second direction D2, wherein the second direction D2 is different from the first direction D1. In some embodiments, the first direction D1 and the second direction D2 are perpendicular to each other, but the disclosure is not limited thereto.

In some embodiments, the first openings 430 in the patterned layer 424 are transferred or extended into the sacrificial layer 423, and thus portions of the core patterns 420, portions of the spacers 422 and portions of the second mask 414 are exposed through the first openings 430. Therefore, in some embodiments, the patterned layer is referred to as a multi-layered structure that includes the patterned photoresist 424 and the patterned sacrificial layer 423. Additionally, the first openings 430 can include different dimensions, as shown in FIGS. 21A, 21B and 21C.

Figure 22A:
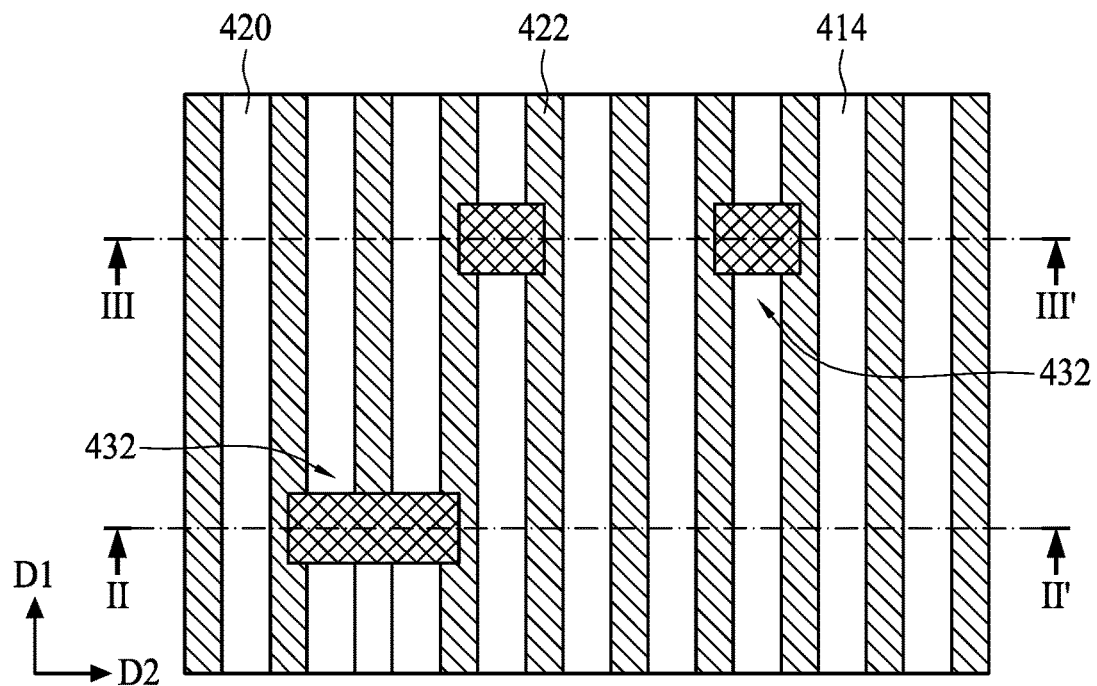
Figure 22B:
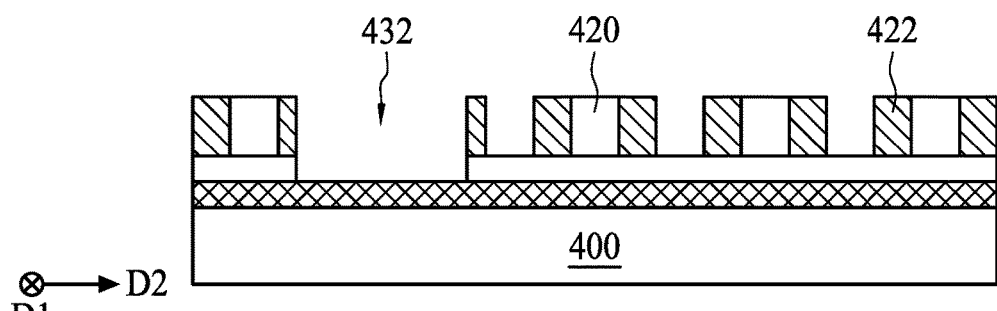
Figure 22C:
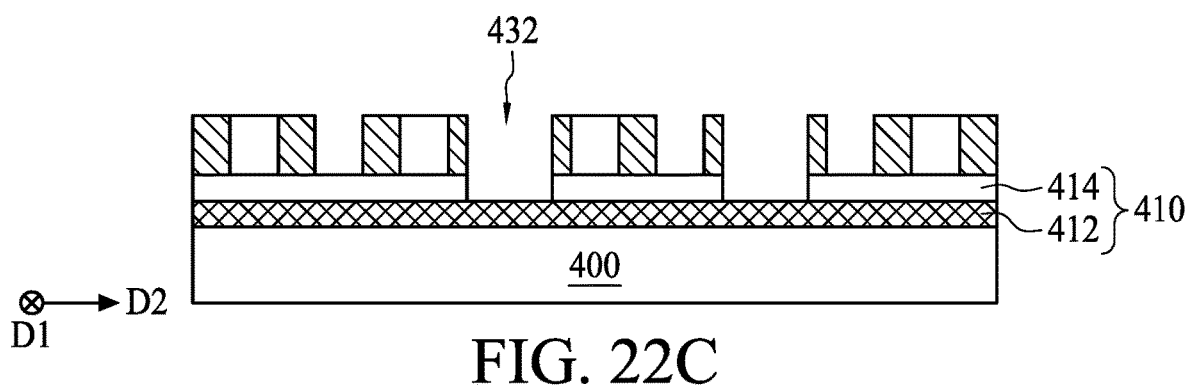

Referring to FIGS. 22A, 22B and 22C, the portions of the core patterns 420, the portions of the spacers 422 and the portions of the second mask 414 exposed through the first openings 430 are removed, according to step 310. In the third embodiment, an etchant that can remove the core patterns 420, the spacers 422 and the second mask 414, which include different materials, is used. Consequently, a plurality of second openings 432 are formed in the second mask 414, as shown in FIGS. 22A, 22B and 22C. Further, the second openings 432 are formed corresponding to the first openings 430. In some embodiments, a width of the second openings 432 the same as a width of the first openings 430, but the disclosure is not limited thereto. Significantly, portions of the first mask 412 are exposed through the second openings 432.

Figure 23A:
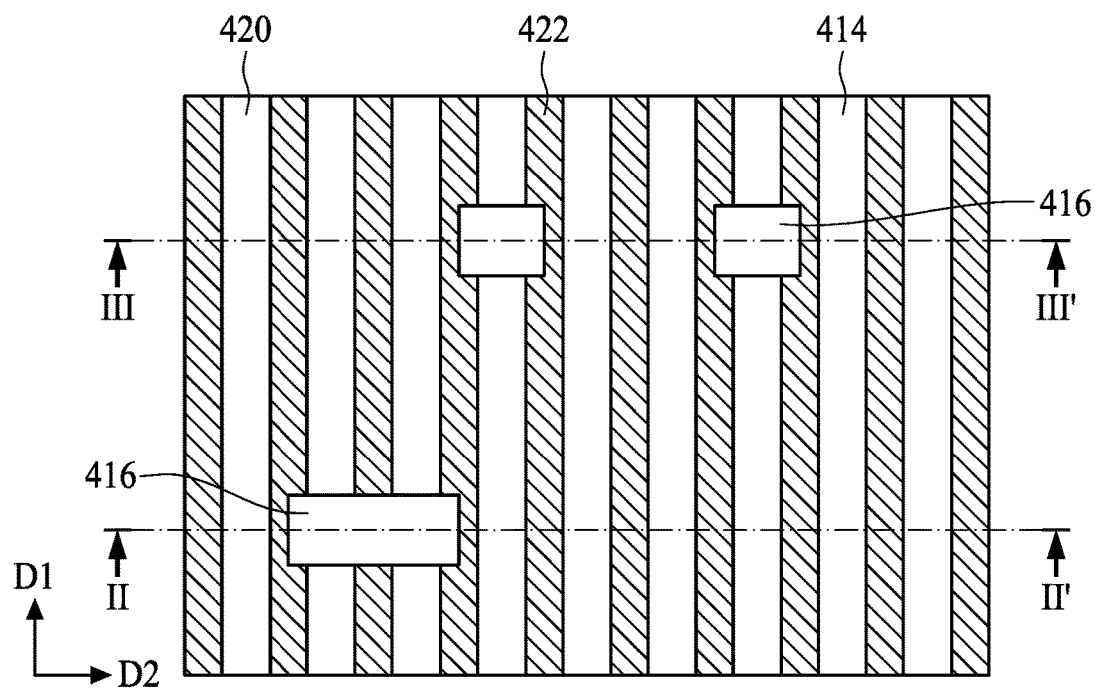
Figure 23B:
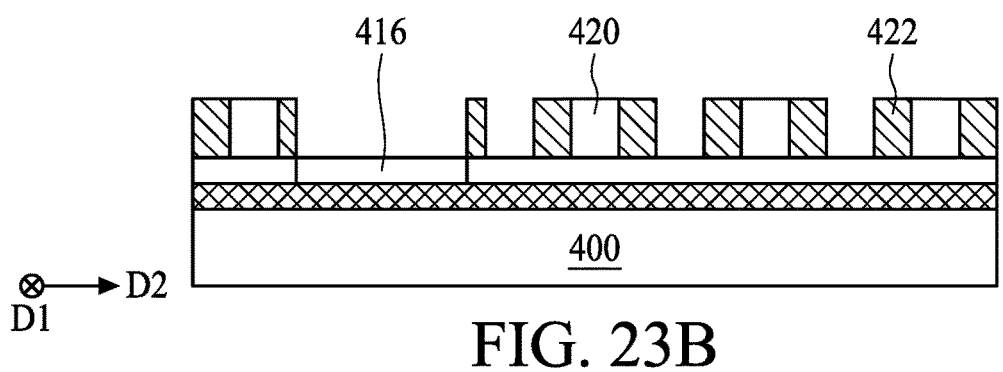
Figure 23C:
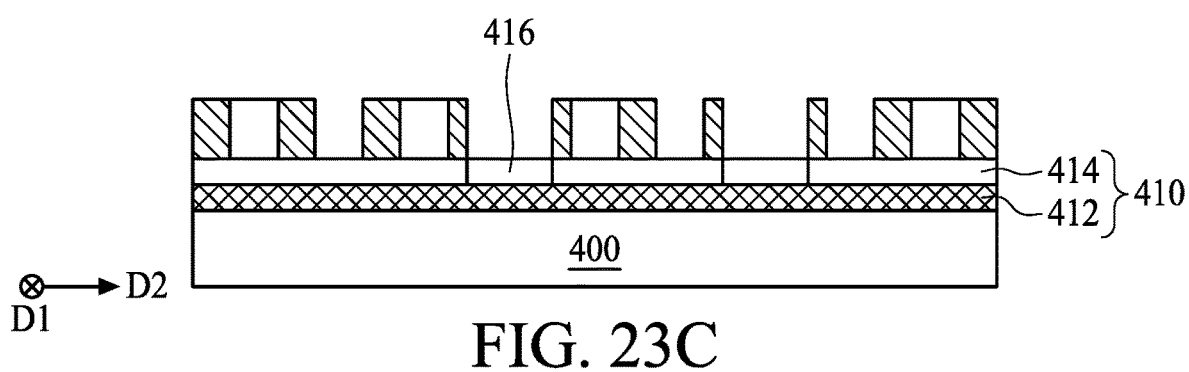

Referring to FIGS. 23A, 23B and 23C, a plurality of self-aligned protecting structures 416 are formed according to step 312. As shown in FIGS. 23A, 23B and 23C, each of the self-aligned protecting structures 416 is formed in one second opening 432. A top surface of each self-aligned protecting structure 416 can be coplanar with or higher than a top surface of the second mask 414. As mentioned above, the materials used to form the self-aligned protecting structures 416 depend on the materials used to form the first mask 412, and therefore description of such details are omitted in the interest of brevity. Significantly, in the selective ALD process or SEG process, the self-aligned protecting structures 416 are formed only on the surface of the first mask 412 exposed through the second openings 432, and thus the protecting structure 416 are "self-aligned" with the second openings 432. Consequently, the portions of the first mask 412 previously exposed through the second openings 432 are now covered by the self-aligned protecting structures 416, as shown in FIGS. 23A, 23B and 23C. In some embodiments, the patterned layer 424 and the sacrificial layer 423 can be removed after the forming of the second openings 432. In other embodiments, the patterned layer 424 and the sacrificial layer 423 can be removed after the forming of the self-aligned protecting structures 416.

Figure 24A:
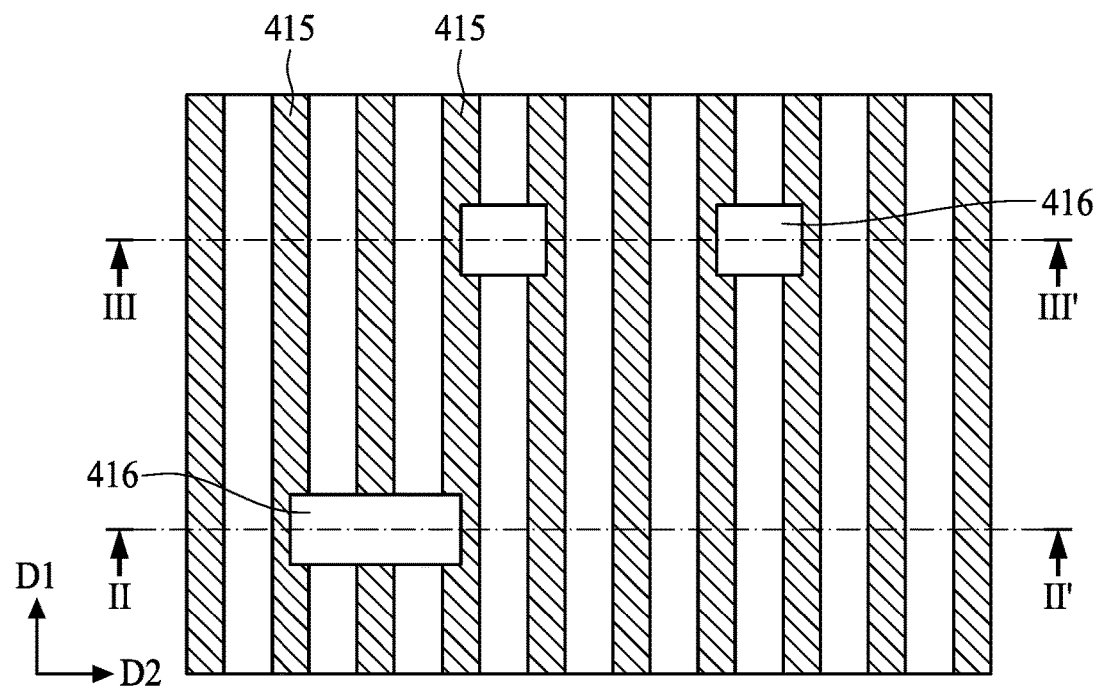
Figure 24B:
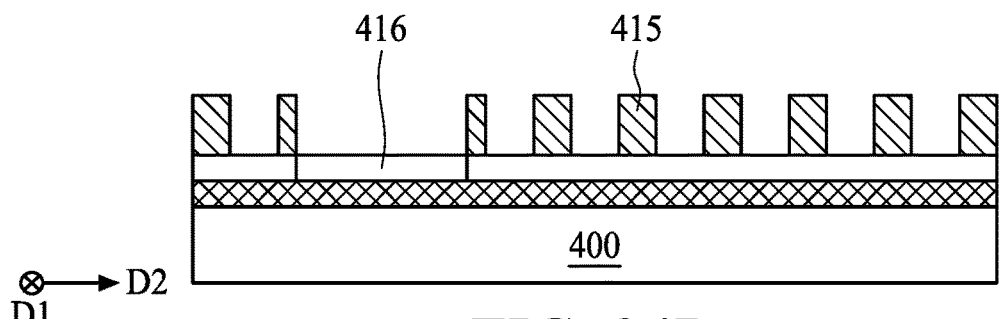
Figure 24C:
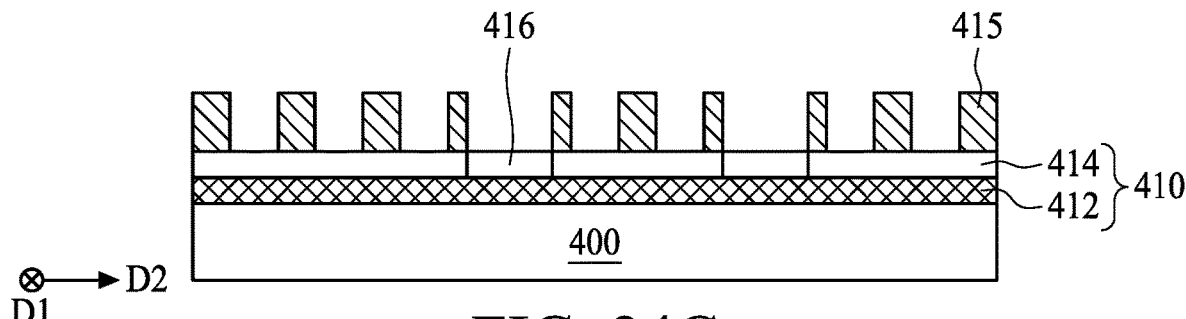

Referring to FIGS. 24A, 24B and 24C, after forming the self-aligned protecting structures 416, the core patterns 420 are removed according to step 314. Consequently, a plurality of third masks 415 are formed. Further, portions of the second mask 414 are exposed through the third masks 415.

Figure 25A:
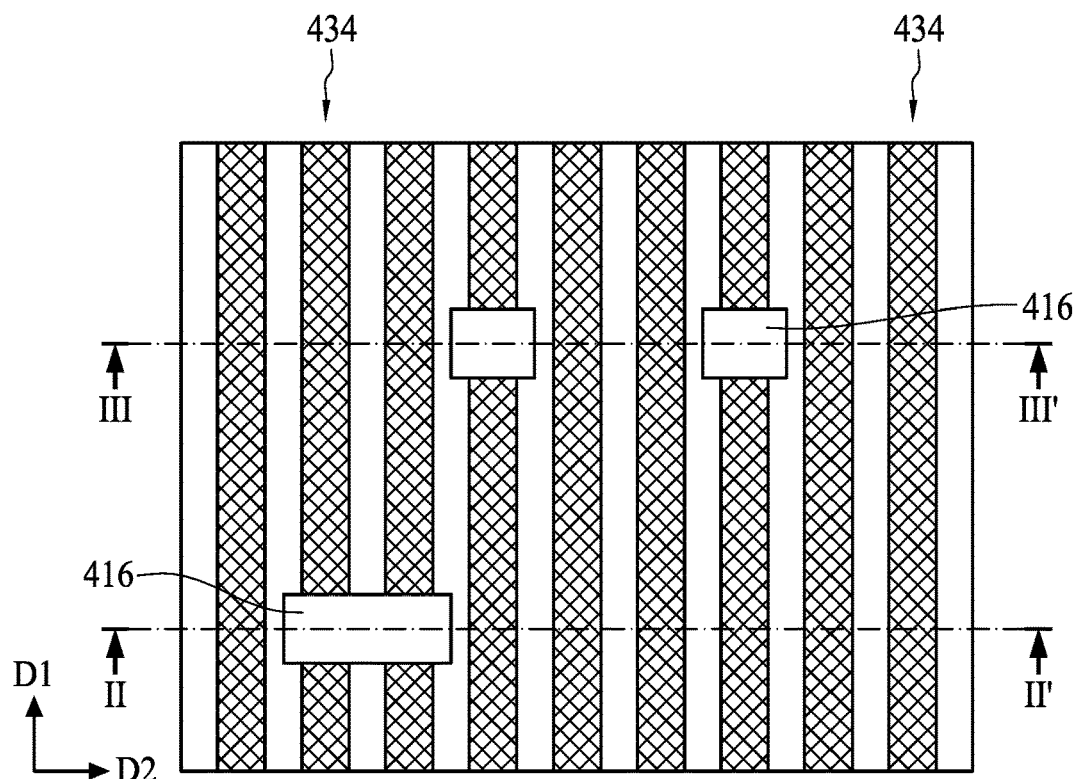
Figure 25B:
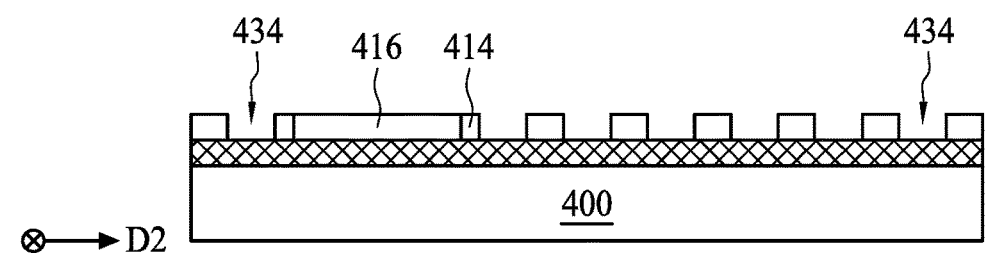
Figure 25C:
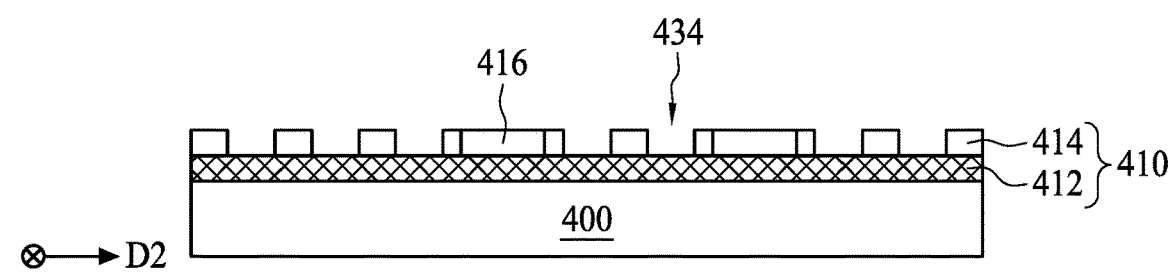

Referring to FIGS. 25A, 25B and 25C, the portions of the second mask 414 exposed through the third masks 415 are removed according to step 316. Consequently, a plurality of third openings 434 are formed in the second mask 414. Further, portions of the first mask 412 are exposed through the third openings 434, as shown in FIGS. 25A, 25B and 25C.

Figure 26A:
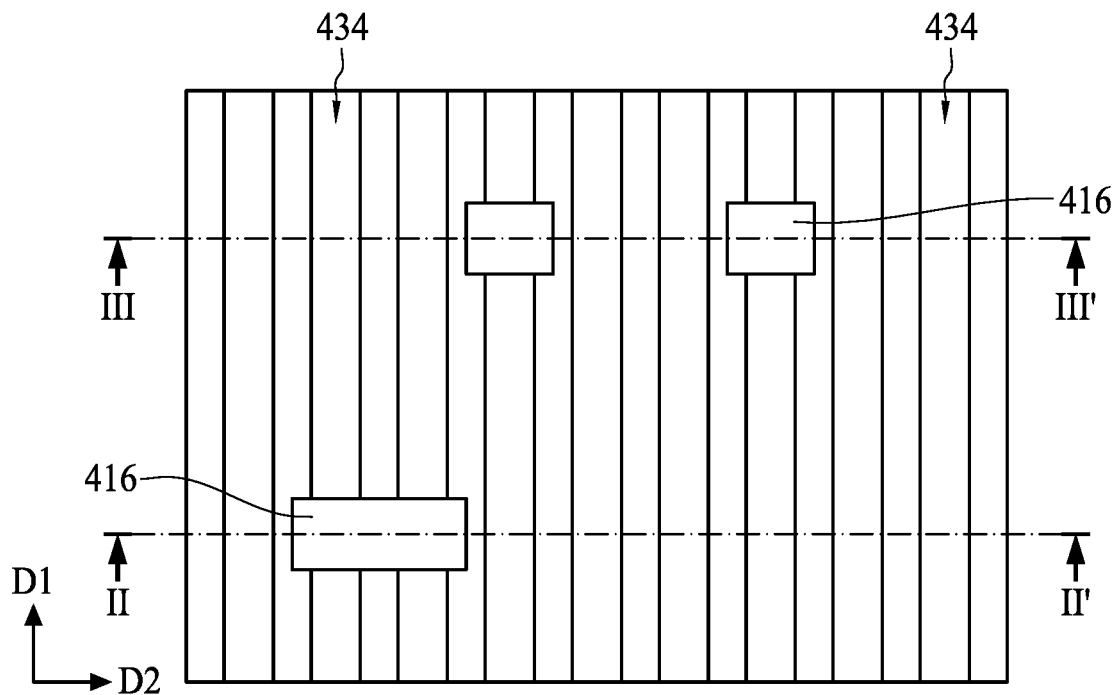
Figure 26B:
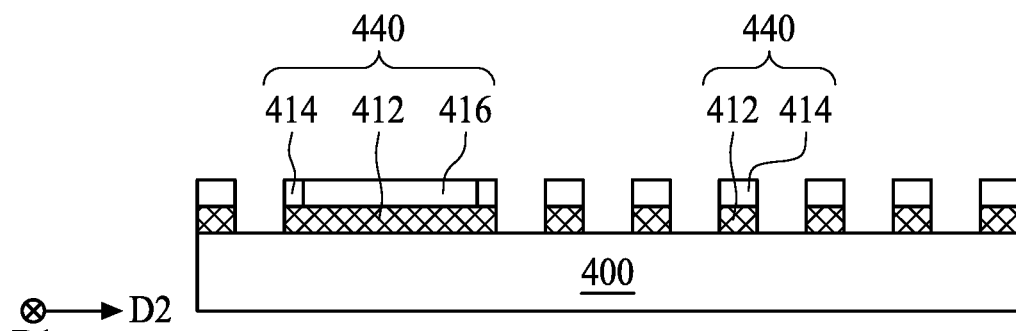
Figure 26C:
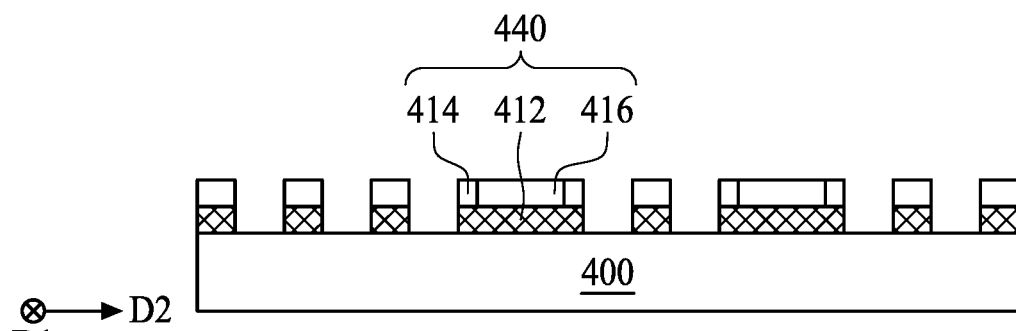

Referring to FIGS. 26A, 26B and 26C, the portions of the first mask 412 exposed through the third openings 434 are removed, according to step 318. Accordingly, a hybrid hard mask 440 is formed, and portions of the target layer or substrate 400 are exposed through the hybrid hard mask 440. In some embodiments, the third masks 415 can be removed after the forming of the third openings 434. In some embodiments, the third masks 415 can be removed after the forming of the hybrid hard mask 440. In some embodiments, the hybrid hard mask 440 includes the first mask 412 and the second mask 414. In those embodiments, the first mask 412 forms a base of the hybrid hard mask 440 while the second mask 414 disposed on the first mask 412 forms a top of the hybrid hard mask 440. In some embodiments, the hybrid hard mask 440 includes the first mask 412, one self-aligned protecting structure 416 and the second mask 414. In those embodiments, the first mask 412 forms a base of the hybrid hard mask 440, while the second mask 414 and the self-aligned protecting structure 416 disposed on the first mask 412 form a top of the hybrid hard mask 440. Further, the self-aligned protecting structure 416 is sandwiched between portions of the second mask 414.

Figure 27A:
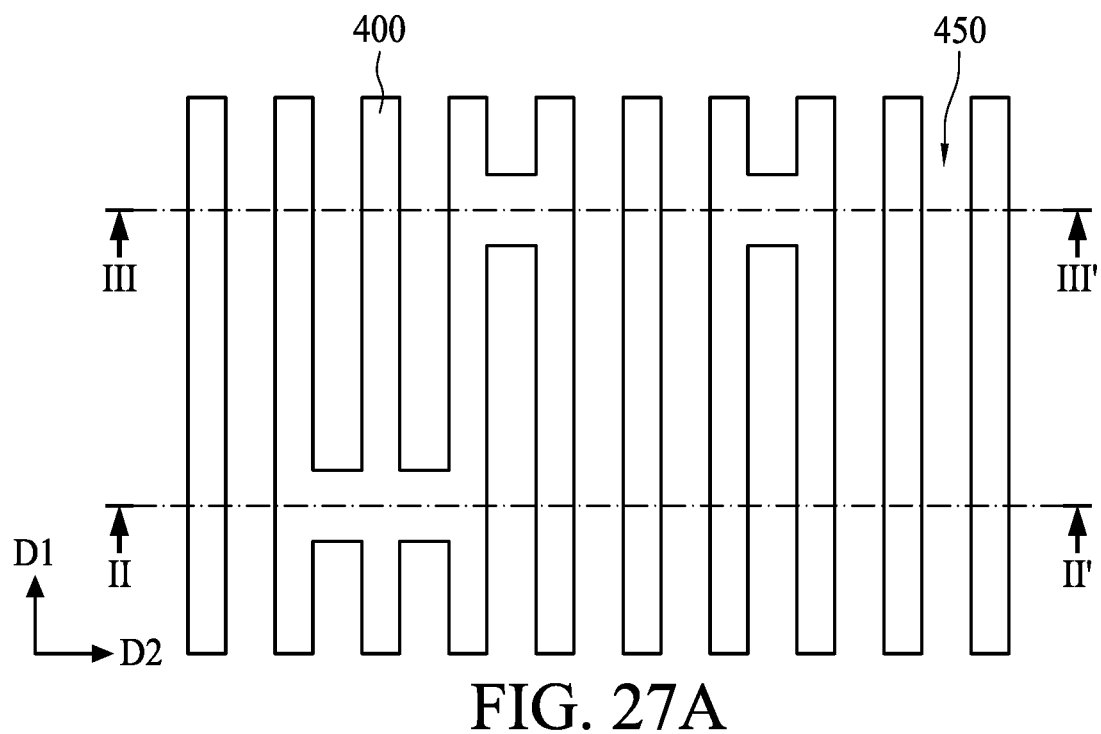
Figure 27B:
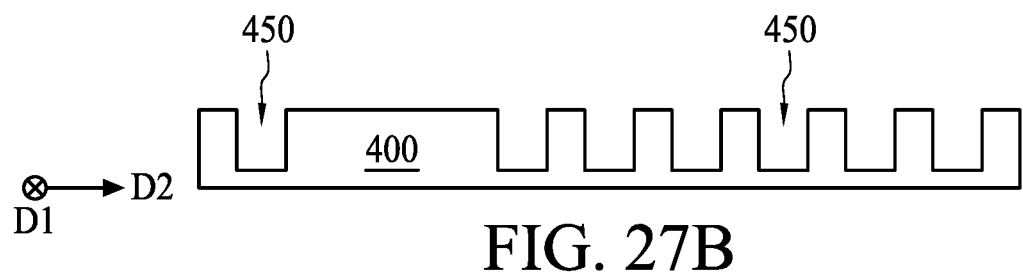
Figure 27C:
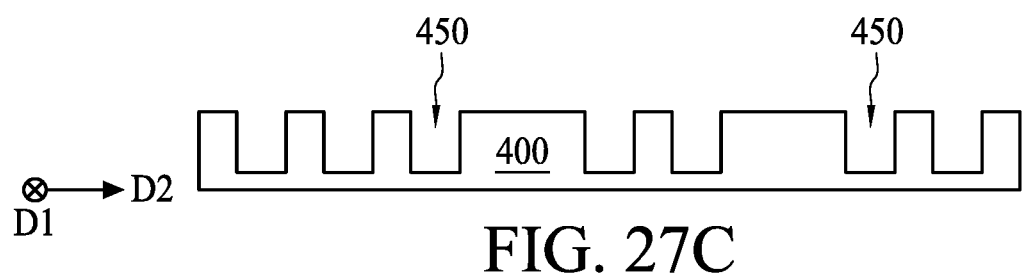

Referring to FIGS. 27A, 27B, 27C, the substrate or the target layer 400 is etched through the hybrid hard mask 440 according to step 320. Accordingly, a plurality of recesses 450 are formed in the substrate or the target layer 400. Significantly, the recesses are separate from each other, as shown in FIGS. 27A, 27B and 27C. In some embodiments, the hybrid hard mask 440 is removed after the forming of the recesses 450, but the disclosure is not limited thereto.

The method 30 further includes a step of forming a conductive layer filling the plurality of recesses. Further, a planarization process such as a CMP process can be performed to remove superfluous conductive layers from the substrate 400, and thus to form a plurality of conductive lines (as shown in FIGS. 13A and 13B) filling the recesses 450 in the substrate or the target layer 400.

According to the method 30 provided by the third embodiment, by using the hybrid hard masks 440 and 442, the circuit constructed by the conductive lines can be formed without the cutting process. Further, by forming the protecting structures 416 self-aligned in the second openings 432, an alignment process can be eliminated. Consequently, the method 30 provided by the first and second embodiments simplifies the process and reduces the process cost.

It should be noted that in the first and second embodiments, the core patterns 220 are removed to form the third masks 215 prior to the forming of the first openings 230. In contrast to the first and second embodiments, the core patterns 420 are removed after the forming of the self-aligned protecting structure 416 in the third embodiment. In the first and second embodiments, since the core patterns 220 are removed to form the third masks 215 prior to the forming of the first openings 230, the uniformity of the patterns over the substrate 200 is improved. Further, the forming of the second openings 232 is simplified because only selectivity between the third masks 215 and the second mask 214 should be considered in the first and second embodiments.

In the present disclosure, the methods for preparing the semiconductor structure 10 and 30 are provided. According to the methods 10 and 30, the self-aligned protecting structures 216, 216' and 416 are formed between portions of the second mask 214 and 414, and thus the hybrid hard mask 240 and 440, including the first mask 212 and 412, the self-aligned protecting structure(s) 216, 216' and 416, and the second mask 214 and 414 is obtained. Accordingly, the substrate 200 and 400 is etched through the hybrid hard mask 240 and 440 to form the recesses 250 and 450 separate from each other. The recesses 250 and 450 are then filled with conductive materials and thus a plurality of metal lines separate from each other are formed. Significantly, no more metal cutting is required, Further, since a process for cutting the metal lines is no longer required, alignment between the cuts and the metal lines is not required, either. Accordingly, the metal lines can be formed without increasing process cost or complexity.

In contrast, with a comparative method, the metal lines are formed and a metal line cutting process is subsequently performed to form the desired circuit. As the pitch of the metal lines is reduced, the opening may cut neighboring lines and electrical connections may be inadvertently broken, and the over-cutting issue makes the interconnection structures unreliable or unusable. Further, the forming of the cuts/openings requires precise alignment, and such requirement makes the process more complicated.

One aspect of the present disclosure provides a method for preparing a semiconductor structure. The method includes the following steps. A target layer is formed over a substrate. A first patterned mask is formed over the target layer. In some embodiments, the first patterned mask includes a plurality of first openings separate from each other. The plurality of first openings are filled with a first sacrificial layer. A patterned core layer is formed on the first sacrificial layer. In some embodiments, the patterned core layer includes a plurality of closed patterns and a plurality of second openings within the plurality of closed patterns. A plurality of spacers are formed on sidewalls of the patterned core layer. The plurality of spacers are removed to form a plurality of third openings over the substrate. The first sacrificial layer and the first patterned mask are etched through the plurality of third openings. The first sacrificial layer is removed to form a second patterned mask on the target layer. The target layer is etched through the second patterned mask to form a patterned target layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing a semiconductor pattern structure, comprising:
    forming a mask stack comprising a first mask and a second mask on a substrate;
    forming a plurality of third masks over the mask stack;
    forming a patterned layer over the third masks, wherein the patterned layer comprises a plurality of first openings;
    removing portions of the second mask through the first openings and through the third masks to form a plurality of second openings, wherein portions of the first mask are exposed through the second openings;
    forming a plurality of self-aligned protecting structures in the second openings;
    removing portions of the second mask exposed through the third masks to form a plurality of third openings, wherein portions of the first mask are exposed through the third openings;
    removing the portions of the first mask exposed through the third openings to form a hybrid hard mask; and
    etching the substrate through the hybrid hard mask to form a plurality of recesses.

2. The method of claim 1, wherein the hybrid hard mask comprises the first mask and the second mask.

3. The method of claim 2, wherein the hybrid hard mask further comprises at least one self-aligned protecting structure.

4. The method of claim 3, wherein the first mask form a base for the hybrid hard mask, the at least one self-aligned protecting structure and the second mask are disposed on the first mask, and the at least one self-aligned protecting structure is sandwiched between portions of the second mask.

5. The method of claim 4, wherein a top surface of the at least one self-aligned protecting structure is coplanar with or higher than a top surface of the second mask.

6. The method of claim 1, wherein the third masks extend along a first direction, and the first openings extend along a second direction different from the first direction.

7. The method of claim 1, wherein the forming of the third masks comprises:
    forming a plurality of core patterns over the mask stack;
    forming a plurality of spacers over sidewalls of each core pattern; and
    removing the core patterns to form the third masks.

8. The method of claim 1, wherein the forming of the patterned layer further comprises:
    forming a sacrificial layer over the third masks to form an even surface over the substrate;
    forming the patterned layer over the sacrificial layer; and
    transferring the first openings into the sacrificial layer.

9. The method of claim 8, further comprising removing the sacrificial layer prior to the forming of the third openings.

10. The method of claim 1, further comprising removing portions of the third masks exposed through the first openings.

11. The method of claim 1, further comprising forming a conductive layer to fill the recesses.

12. The method of claim 1, further comprising forming a conductive layer to fill the recesses.

13. A method for preparing a semiconductor pattern structure, comprising:
    forming a mask stack comprising a first mask and a second mask on a substrate;
    forming a plurality of core patterns over the mask stack;
    forming a plurality of spacers over sidewalls of each core pattern;
    forming a patterned layer over the core patterns and the spacers, wherein the patterned layer comprises a plurality of first openings;
    removing portions of the core patterns, portions of the spacers and portions of the second mask exposed through the first openings to form a plurality of second openings, wherein portions of the first mask are exposed through the second openings;
    forming a plurality of self-aligned protecting structures in the second openings;
    removing the core patterns to form a plurality of third masks exposing portions of the second mask;
    removing the portions of the second mask exposed through the third masks and through the self-aligned protecting structures to form a plurality of third openings, wherein portions of the first mask are exposed through the third openings;
    removing the portions of the first mask exposed through the third openings to form a hybrid hard mask; and etching the substrate through the hybrid hard mask to form a plurality of recesses.

14. The method of claim 13, wherein the hybrid hard mask comprises the first mask and the second mask.

15. The method of claim 14, wherein the hybrid hard mask further comprises the self-aligned protecting structure.

16. The method of claim 15, wherein the first mask forms a base for the hybrid hard mask, the self-aligned protecting structure and the second mask are disposed on the first mask, and the self-aligned protecting structure is sandwiched between portions of the second mask.

17. The method of claim 16, wherein a top surface of the self-aligned protecting structure is coplanar with or higher than a top surface of the second mask.

18. The method of claim 13, wherein the third masks extend along a first direction, and the first openings extend along a second direction different from the first direction.

19. The method of claim 13, wherein the forming of the patterned layer further comprises:
forming a sacrificial layer over the core patterns and the spacers to form an even surface over the substrate;
forming the patterned layer over the sacrificial layer; and
transferring the first openings into the sacrificial layer.

20. The method of claim 18, further comprising removing the sacrificial layer prior to the forming of the third openings.

* * * * *